(12) United States Patent
Sakata et al.

(10) Patent No.: US 8,402,422 B2
(45) Date of Patent: Mar. 19, 2013

(54) WIRING DESIGN DEVICE, METHOD AND RECORDING MEDIUM

(75) Inventors: Toshiyasu Sakata, Kawasaki (JP); Eiichi Konno, Kawasaki (JP); Takahiko Orita, Kawasaki (JP); Kazunori Kumagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 37 days.

(21) Appl. No.: 13/048,687

(22) Filed: Mar. 15, 2011

(65) Prior Publication Data
US 2011/0231809 A1    Sep. 22, 2011

(30) Foreign Application Priority Data
Mar. 17, 2010 (JP) .................................. 2010-61424

(51) Int. Cl.
G06F 17/50 (2006.01)
(52) U.S. Cl. ........................ 716/137; 716/136
(58) Field of Classification Search .......... 716/115–116, 716/136–137
See application file for complete search history.

(56) References Cited

U.S. PATENT DOCUMENTS

| 8,201,133 | B2 * | 6/2012 | Cases et al. | 716/137 |
| 2006/0095872 | A1 * | 5/2006 | McElvain et al. | 716/1 |
| 2008/0230258 | A1 * | 9/2008 | Shen et al. | 174/251 |

FOREIGN PATENT DOCUMENTS

| JP | 03-250266 | 11/1991 |
| JP | 11-316774 | 11/1999 |
| JP | 2001-184384 | 7/2001 |

* cited by examiner

Primary Examiner — Binh Tat
(74) Attorney, Agent, or Firm — Fujitsu Patent Center

(57) ABSTRACT

A wiring design device to conduct wiring design on a printed wiring board that includes a plurality of conductive layers, the wiring design device including: noise contaminating part extracting means for extracting a part in a condition where noise contaminates a signal, the part being on a wiring-designed line, based on a route of the line and a physical condition around the route; route modification processing means for modifying the route of the line by moving the extracted part on the line in the condition where noise contaminates the signal to a position that avoids the condition where noise contaminates the signal; and line length adjusting means for conducting a line length adjustment on the line to compensate for a variation of the line length of the line when the variation of the line length of the line occurs due to modifying the route of the line.

16 Claims, 34 Drawing Sheets

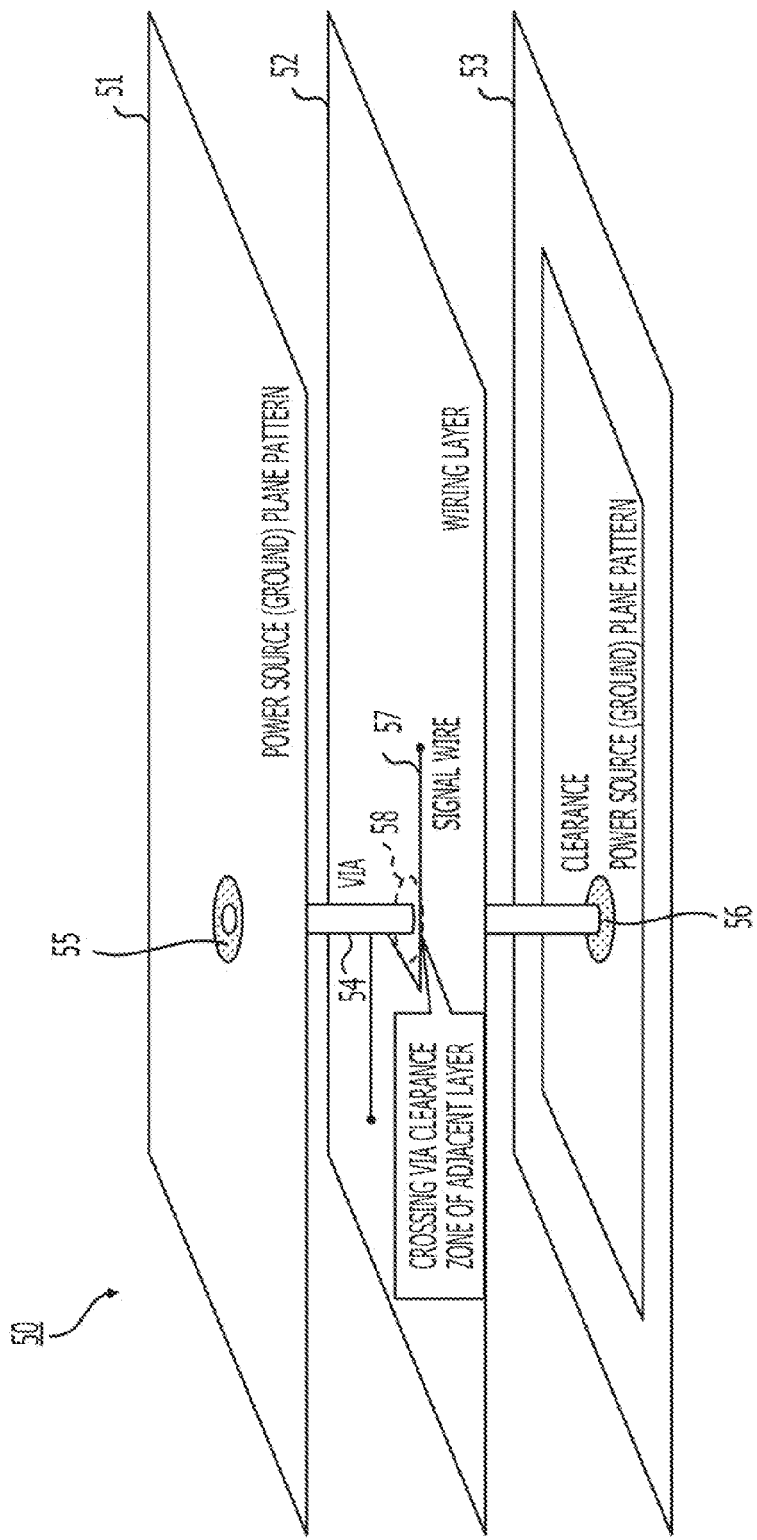

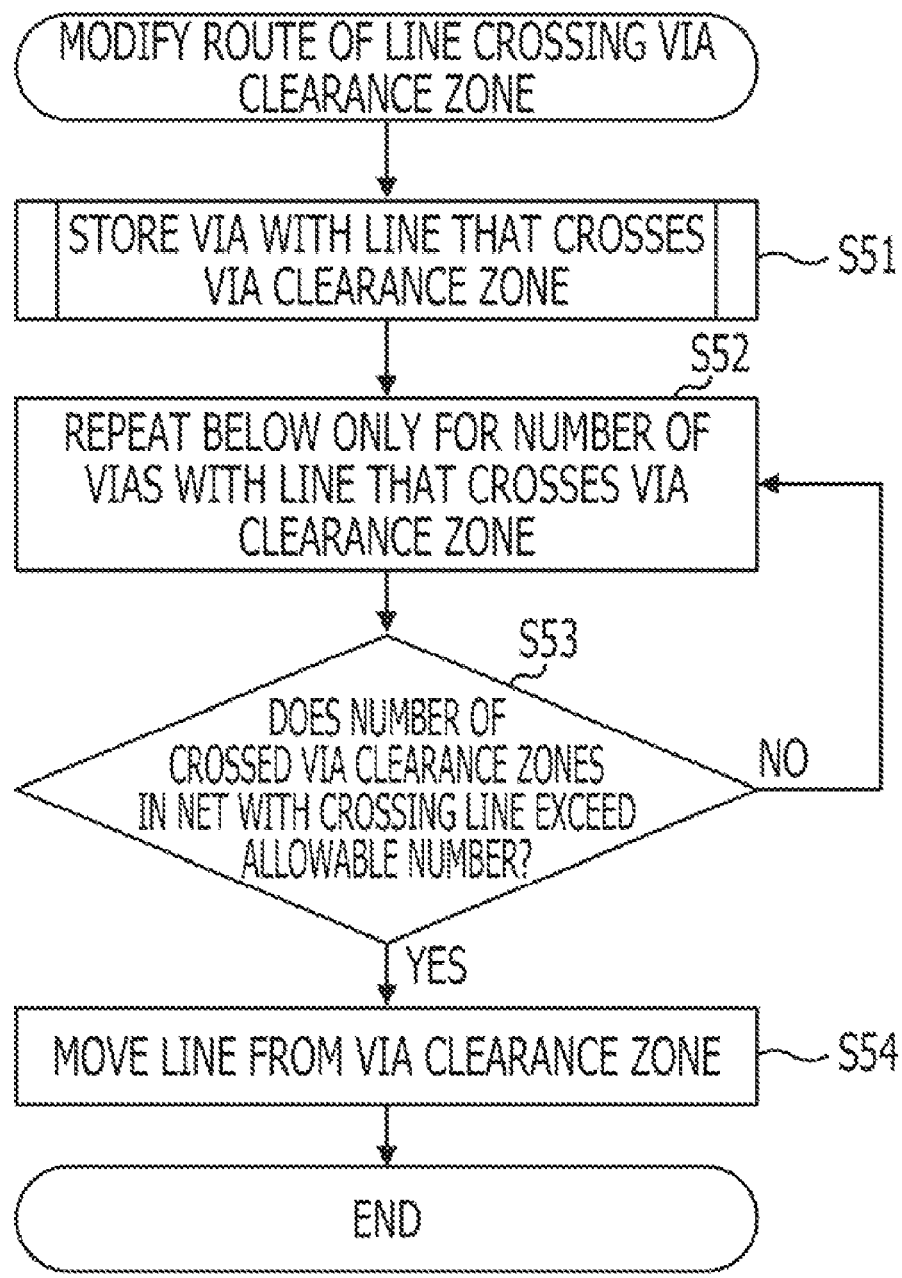

WIRING DESIGN DEVICE, METHOD AND RECORDING MEDIUM

CROSS-REFERENCE TO RELATED APPLICATION

This application is based upon and claims the benefit of priority from the prior Japanese Patent Application No. 2010-061424 filed on Mar. 17, 2010, the entire contents of which are incorporated herein by reference.

FIELD

Illustrative examples described herein relate to designing wiring for print wiring boards that have multiple conductive layers.

BACKGROUND

Recently, the communication speed set in microprocessors and on printed wiring boards that have microprocessors have been increasing every year. The communication speed in microprocessors and on printed wiring boards that have microprocessors have rapidly increased from, for example, Mbps to Gbps class.

FIG. 1 is a graph that represents a year by year increase in LSI operating frequencies. Along with the rise in LSI operating frequencies, printed wiring boards (substrates) with line length limitations are also being employed. The communication speeds set in printed wiring boards is 1.25 Gbps for gigabit Ethernet (registered trademark), 2.5 Gbps for PCI Express (registered trademark), and 1.5 Gbps for Serial ATA.

Along with the increase in communication speeds and a decrease in voltage, the amount of noise affecting signals has increased and as a result signals have become less tolerant of noise. As a result, noise countermeasures have become a serious issue for printed wiring boards (see Japanese Unexamined Patent Application Publications 11-316774 (reference document 1) and 3-250266 (reference document 2)).

Furthermore, wiring constraint instructions in wiring design such as limiting line length to reduce noise in printed wiring boards are a matter of course (see, for example, Japanese Unexamined Patent Application Publication 2001-184384 (reference document 3)).

Generally, the work of designing wiring for printed wiring boards is conducted by frequently redoing the wiring and modifying routes for assuring the line length limitations indicated by the wiring constraints. In traditional wiring design work for printed wiring boards, much effort was desired to design wiring that avoids various scenarios that add noise to signals and, as a result, bypass work to conduct wiring that avoids adding noise to signals was not performed.

Thus, previous wiring design work for printed wiring boards included much manual searching and repairing of various patterns that added noise to signals by the user after completing the wiring design work, to assure the line length limitations indicated by the wiring constraints.

After completing all the wiring design work to assure the line length limitations indicated in the wiring constraints, the various patterns that add noise to the signals need to be revised while maintaining the assured line length limitation conditions indicated by the wiring constraints when searching for and revising such patterns.

Previously in wiring design work, a user could manually search for and revise the patterns that added noise to signals since such patterns were few and the X and Y axes are considered for printed wiring boards that had one conductive layer or for printed wiring boards with low communication speeds.

However, for printed wiring boards that have multiple conductive layers, searching for and revising the various patterns (physical conditions) that add noise to signals by a user takes too much time due to the increase in parts that desire revising because of the increase in communication speeds and the increase in the scale of printed wiring boards.

SUMMARY

According to an embodiment, a wiring design device to conduct wiring design on a printed wiring board that includes a plurality of conductive layers, the wiring design device including: noise contaminating part extracting means for extracting a part in a condition where noise contaminates a signal, the part being on a wiring-designed line, based on a route of the line and a physical condition around the route; route modification processing means for modifying the route of the line by moving the extracted part on the line in the condition where noise contaminates the signal to a position that avoids the condition where noise contaminates the signal; and line length adjusting means for conducting a line length adjustment on the line to compensate for a variation of the line length of the line when the variation of the line length of the line occurs due to modifying the route of the line.

The object and advantages of the invention will be realized and attained by at least the features, elements, and combinations particularly pointed out in the claims.

It is to be understood that both the foregoing summary description and the following detailed description are exemplary and explanatory as to some embodiments of the present invention, and not restrictive of the present invention as claimed.

BRIEF DESCRIPTION OF THE DRAWINGS

FIG. 6 is an example of a configuration indicating a printed wiring board layer structure that has multiple conductive layers while conducting wiring design;

FIG. 16 is another example flowchart illustrating procedures for the route modification process;

DESCRIPTION OF EMBODIMENTS

Figure 1:
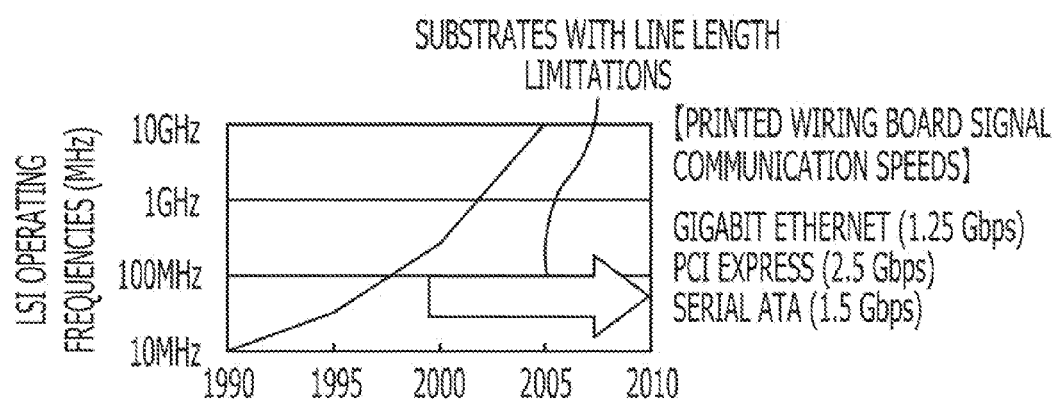
FIG. 1 is a graph that represents a year by year increase in LSI operating frequencies.

Embodiments discussed herein will be described based on the following illustrative examples while referring to the drawings. The illustrative examples herein describe a CAD (Computer Aided Design) device as an example of a wiring design device, but the illustrative examples of the present embodiments are not limited to a CAD device.

(Hardware Configuration)

Figure 2:
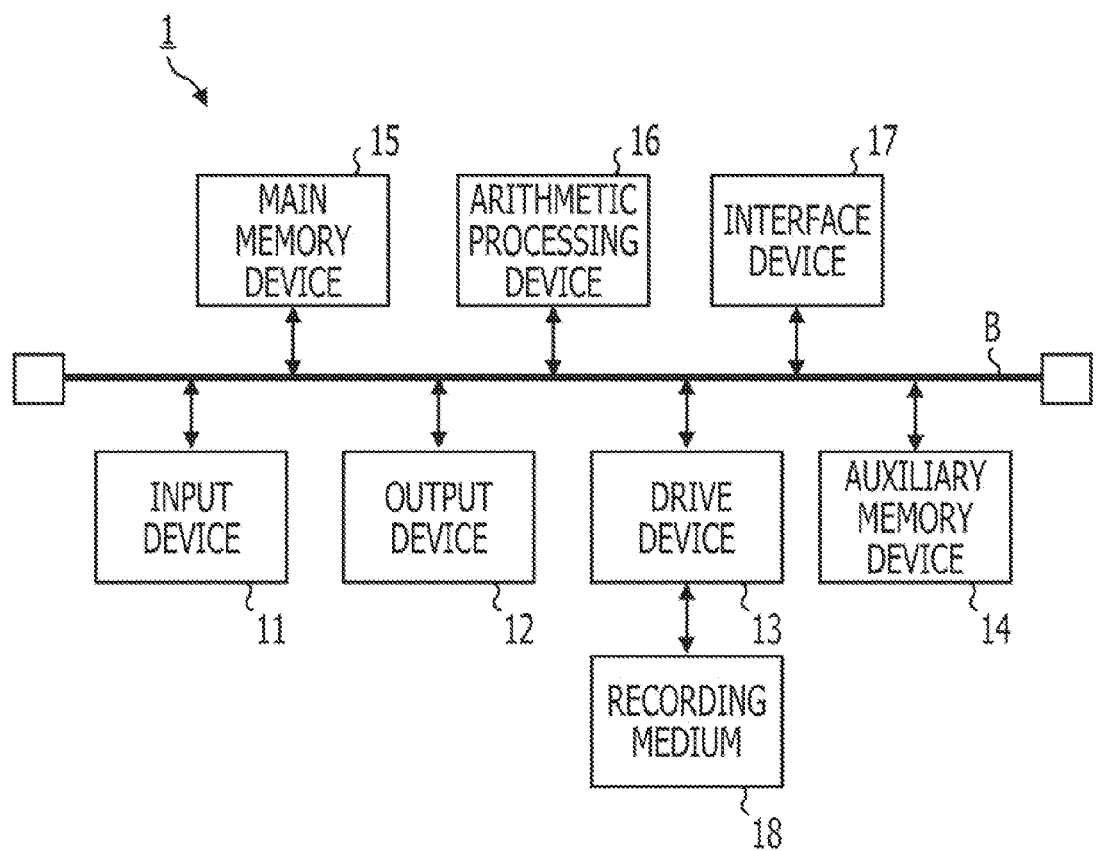
FIG. 2 is an example of a hardware configuration of an illustrative example of a CAD device.

FIG. 2 is an example of a hardware configuration of a CAD device according to the illustrative examples of the present embodiments. A CAD device 1 may be a stand-alone device or a device connected to a user terminal through a network such as the Internet or a LAN for allowing data communication, for example. The CAD device 1 has an input device 11, an output device 12, a drive device 13, an auxiliary memory device 14, a main memory device 15, an arithmetic processing device 16, and an interface device 17 all connected to each other through a bus B.

The input device 11 is a keyboard and a mouse or the like. The input device 11 is used for inputting various types of signals. The output device 12 is a display device or the like. The output device 12 is used for displaying various types of windows and data and the like. The interface device 17 is a modem or a LAN card and the like. The interface device 17 is used for connecting to a network.

A wiring design program of the illustrative example of the present embodiments is at least a part of various programs for controlling the CAD device 1. The wiring design program may be provided, for example, by the distribution of a recording medium 18 or by downloading from a network. The recording medium 18 that records the wiring design program may be any of various types of recording media such as a recording medium that magnetically, electrically or optically records information such as a CD-ROM, a floppy disc, or a magneto-optical disc, or a semiconductor memory that electrically records information such as a ROM or a flash memory, for example.

When the recording medium 18 that stores the wiring design program is set in the drive device 13, the wiring design program is installed in the auxiliary memory device 14 from the recording medium 18 through the drive device 13. A wiring design program downloaded from the internet is installed in the auxiliary memory device 14 via the interface device 17. The auxiliary memory device 14 stores desired files and data and the like as well as the installed wiring design program.

The main memory device 15 reads out and stores the wiring design program from the auxiliary memory device 14 when the CAD device 1 is turned on. The arithmetic processing device 16 performs various processes described below according to the wiring design program stored in the main memory device 15.

(Block Configuration)

Figure 3:
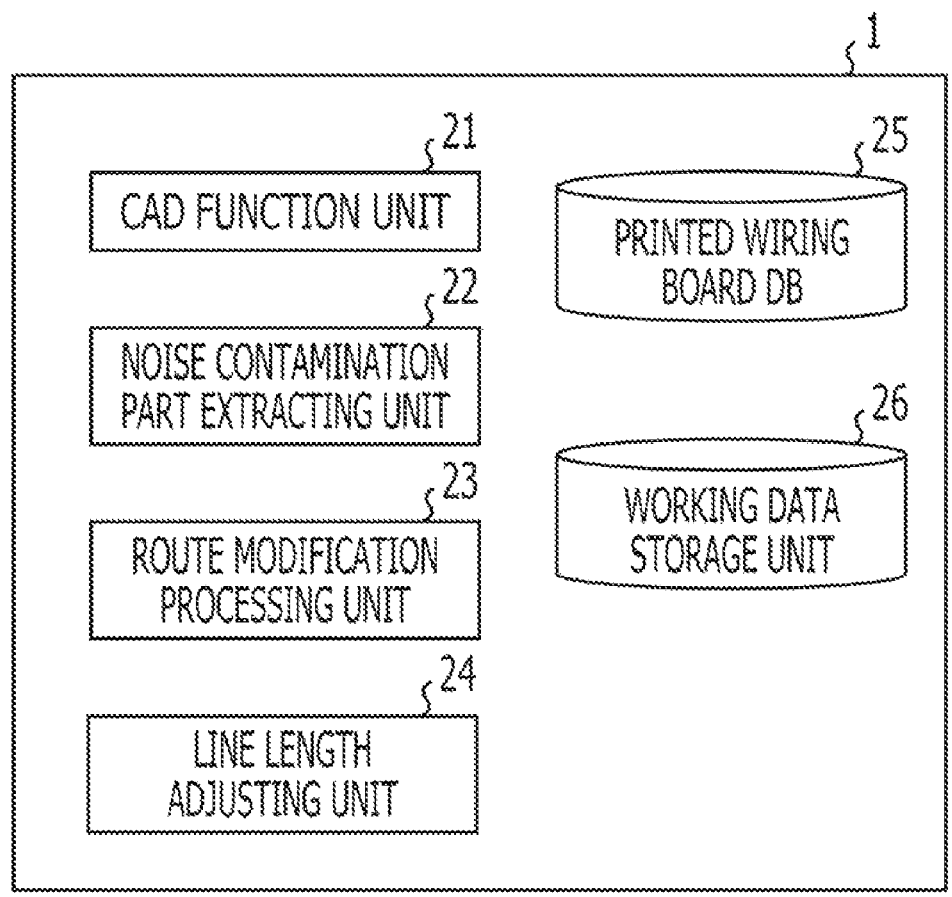
FIG. 3 is an example of a block configuration of the present illustrative example of the CAD device.

FIG. 3 is an example of a block configuration of the CAD device of an illustrative example of the present embodiments. The CAD device 1 has a CAD function unit 21, a noise contamination part extracting unit 22, a route modification processing unit 23, a line length adjusting unit 24, a printed wiring board database (DB) 25, and a working data storage unit 26.

The CAD function unit 21 has general CAD functions. The CAD function unit 21 has well-known functions such as those described in, for example, Japanese Unexamined Patent Application Publication 11-110434. The CAD function unit 21 has functions to calculate line (signal line) length, parallel running distance, and gaps, and functions to make displays on a screen. The CAD function unit 21 completes the series of wiring design operations to assure the line length limitations and isometric wiring and other specified line lengths indicated by the wiring constraints. The functions of the CAD function unit 21 are well known and a description will be omitted.

The noise contamination part extracting unit 22 extracts a part on a line with a condition where noise contaminates signals due to the line route and physical conditions around the line using the wiring design completed sequentially by the CAD function unit 21. Details of the noise contamination part extracting unit 22 will be described below.

The route modification processing unit 23 modifies a line route by moving the part, which is extracted by the noise contamination part extracting unit 22, on the line with the condition where noise contaminates signals, to a position that avoids the condition where noise contaminates signals. Details of the route modification processing unit 23 will be described below.

Furthermore, the line length adjusting unit 24 adjusts the line length so that even when variations in line length occur due to the route modification processing unit 23 modifying a line route, the specified line length assured condition can be maintained. Details of the line length adjusting unit 24 will be described below. The noise contamination part extracting unit 22, the route modification processing unit 23, and the line length adjusting unit 24 of the CAD device 1 are added functions in the illustrative example of the present embodiments.

Figure 4:
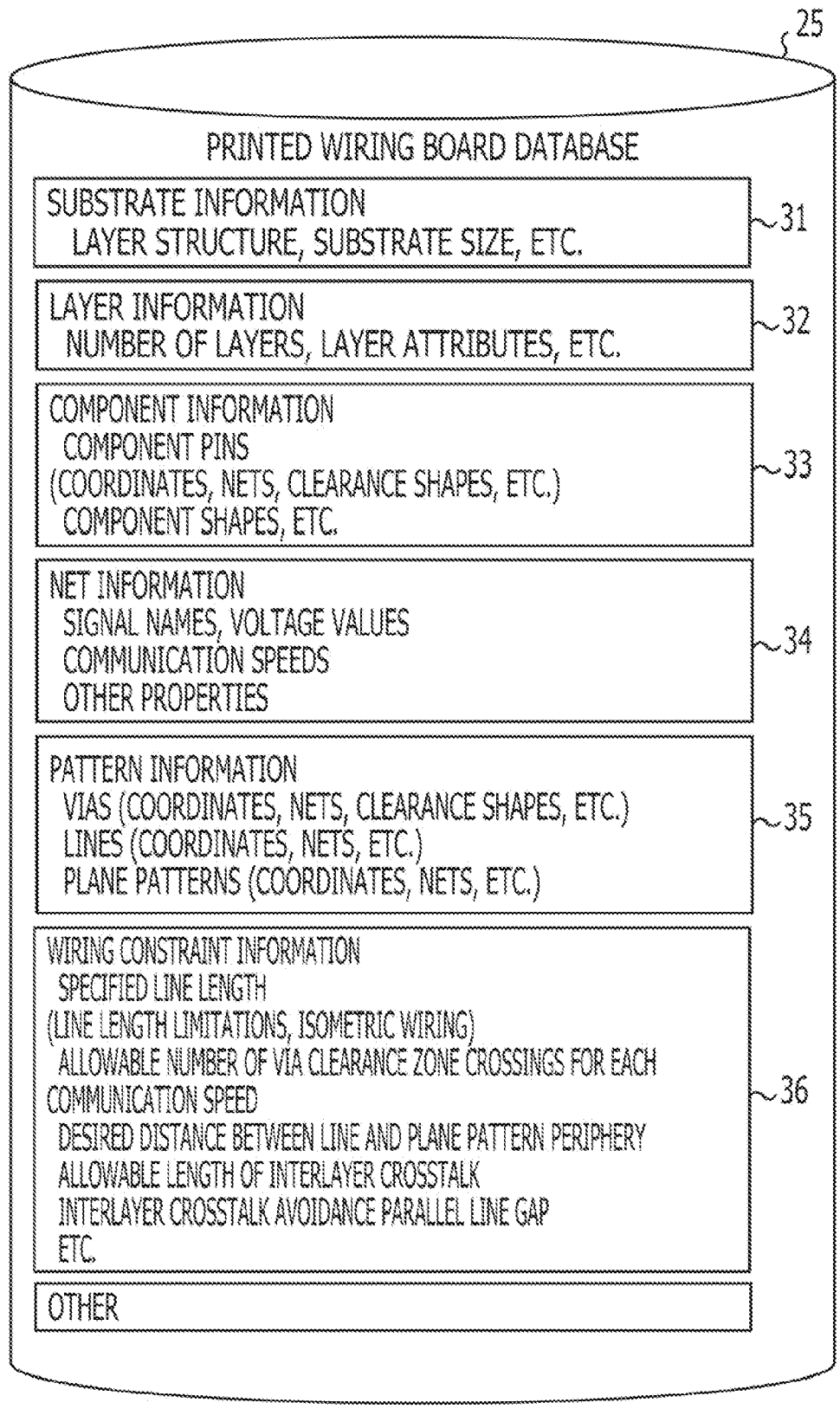
FIG. 4 is an example of a data structure of a printed wiring board DB.

The printed wiring board DB 25 stores various types of information used by the CAD device 1. FIG. 4 is an example of a data configuration of a printed wiring board DB. The printed wiring board DB 25 illustrated in FIG. 4 includes substrate information 31, layer information 32, component information 33, net information 34, pattern information 35, and wiring constraint information 36.

The substrate information 31 includes information on layer structure, substrate size, and the like. The layer information 32 includes information on the number of layers, attributes of the layers, and the like. The component information 33 includes information on component pins, component shapes, and the like. The component pin information includes coordinates, nets, clearance shapes, and the like. The net information 34 includes information on signal names, voltage values, communication speeds, and other properties.

Further, the pattern information 35 includes information on vias, lines, plane patterns, and the like. Via information includes coordinates, nets, clearance shapes, and the like. Line information includes coordinates, nets, and the like. Plane pattern information includes coordinates, nets, and the like.

Further, the wiring constraint information 36 is information that includes specified line length, allowable number of via clearance zone crossings per communication speed, desired distance between line and plane pattern periphery, allowable length of interlayer crosstalk, interlayer crosstalk avoidance parallel line gaps, and the like. The specified line length information includes line length limitations, isometric wiring designations, and the like.

Figure 5:
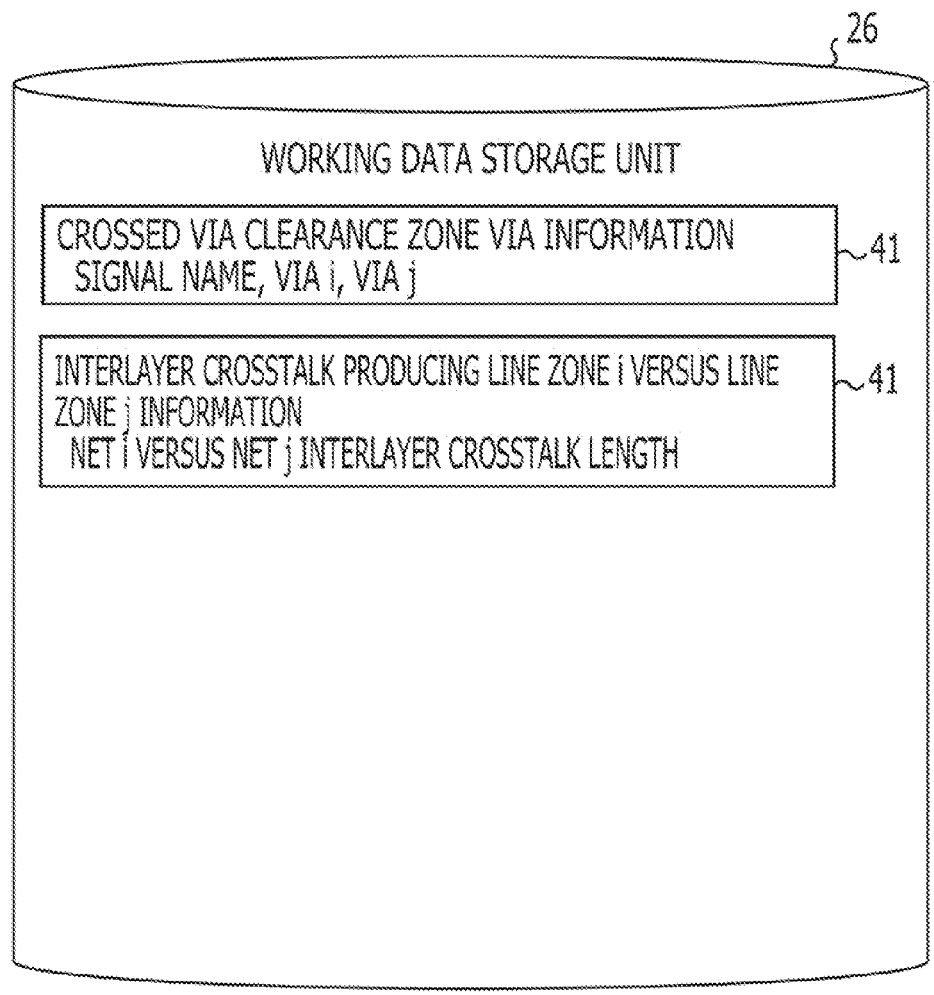
FIG. 5 is an example of a data structure of a working data storage unit.

Returning to FIG. 3, the working data storage unit 26 stores working data created during the processing by the CAD device 1. FIG. 5 is an example of a data structure of a working data storage unit. The working data storage unit 26 stores, for example, crossed via clearance zone via information 41 for each line, and interlayer crosstalk producing line zone i versus line zone j information 42, and the like. The crossed via clearance zone via information 41 for each line is associated with the name of the signal (line) that crosses the via clearance zone, and the via corresponding to the via clearance zone through which the signal crosses, and the like. The interlayer crosstalk producing line zone i versus line zone j information 42 represents the interlayer crosstalk length of the net i compared to the net j.

ILLUSTRATIVE EXAMPLE 1

FIG. 6 is an example of a configuration indicating a printed wiring board layer structure that has multiple conductive layers while conducting wiring design. A printed wiring board 50 in FIG. 6 has a layer structure that includes an adjacent layer 51 that has a power source (ground) plane pattern, a wiring layer 52, and an adjacent layer 53 that includes a power source (ground) plane pattern.

The printed wiring board 50 is provided with a via 54 that crosses the adjacent layer 51, the wiring layer 52, and the adjacent layer 53. The via 54 is formed, for example, with conductive plating for connecting the layers on the inside of the hole that crosses the layers. The adjacent layers 51 and 53 are provided with clearances 55 and 56 (hereinafter called "via clearances") respectively for isolating the power source (ground) plane patterns and the via 54.

The wiring layer 52 is routed with a line (signal wire) 57. The line 57 crosses a position 58 (hereinbelow simply called "via clearance zone") that corresponds to the via clearance 55 of the adjacent layer 51 and the via clearance 56 of the adjacent layer 53, and which is on the wiring layer 52. The part of the line 57 crossing the via clearance zone 58 is an example of a part on the line 57 in a condition where noise contaminates a signal due to the line 57 route and physical conditions around the line 57.

The CAD device 1 of the illustrative example of the present embodiments modifies the route of the line 57 by moving the part of the line 57 that crosses the via clearance zone 58 to a position that avoids the condition where noise contaminates the signal, or in other words, where the line 57 does not cross the via clearance zone 58. Furthermore, the CAD device 1 of the illustrative example of the present embodiments adjusts the line length of the line 57 to maintain a condition where the specified line length is assured even if the line length is varied due to changing the route of the line 57.

Figure 7A:
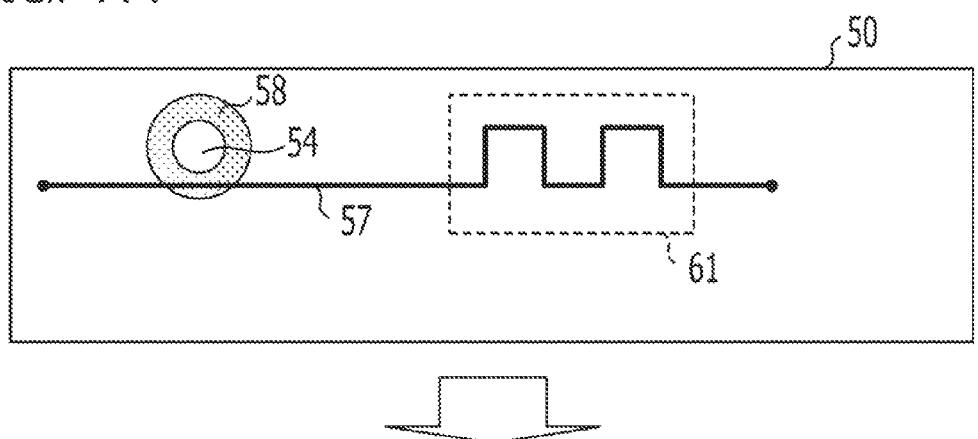
FIGS. 7A and 7B illustrate an example of a route modification process and a line length adjusting process.
Figure 7B:
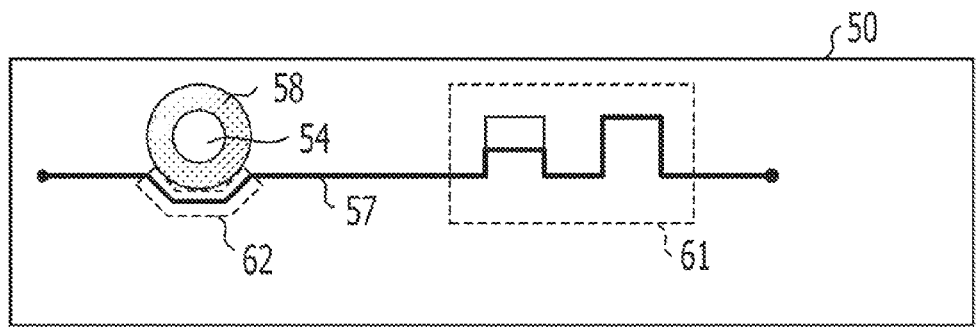

FIGS. 7A and 7B illustrate an example of a route modification process and a line length adjusting process. FIGS. 7A and 7B are transparent views of the printed wiring board 50 as seen from above. In FIG. 7A, the line 57 crosses the via clearance zone 58. Further, in FIG. 7A, a meander section 61 is created for adjusting the line length of the line 57.

In FIG. 7B, the route is modified to create a bypass 62 that does not cross the via clearance zone 58 for the part of the line 57 that crosses the via clearance zone 58. Further, in FIG. 7B, the meander section 61 is shortened to maintain the specified line length since the line length has been extended due to the creation of the bypass 62 in the line 57.

Figure 8A:
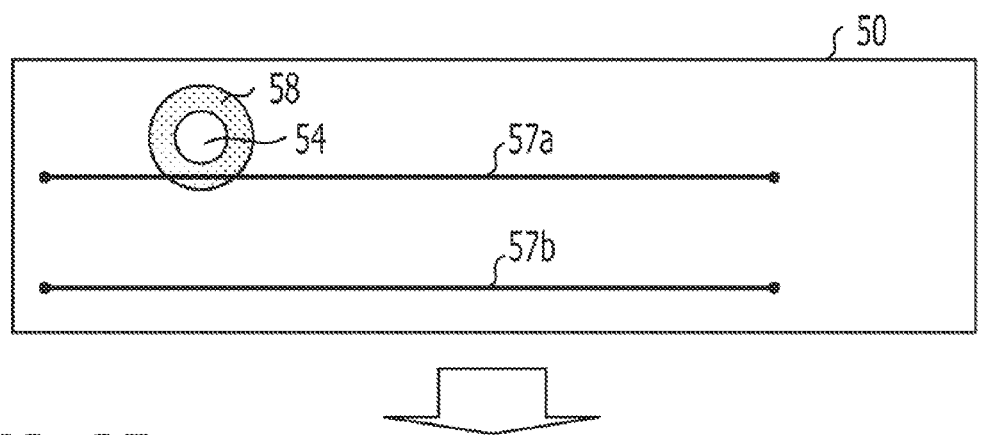
FIGS. 8A and 8B illustrate another example of the route modification process and the line length adjusting process.
Figure 8B:
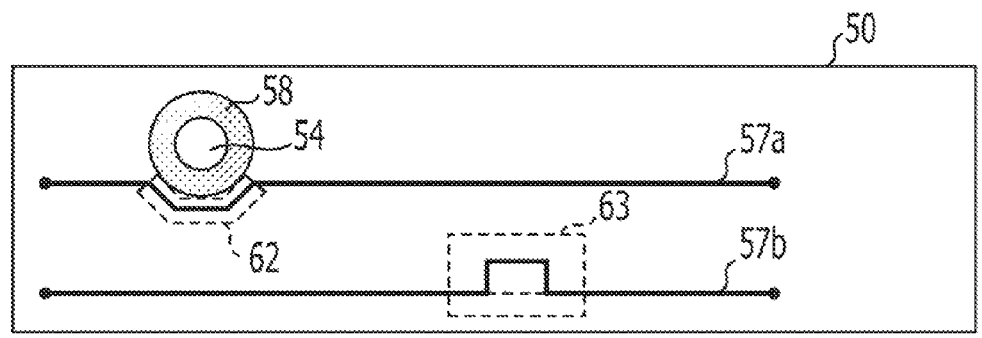

FIGS. 8A and 8B illustrate another example of the route modification process and the line length adjusting process. FIGS. 8A and 8B are transparent views of the printed wiring board 50 seen from above. In FIG. 8A, isometric wiring lines 57a and 57b are routed. In FIG. 8A, the line 57a crosses the via clearance zone 58. Further, in FIG. 8A, a meander section is not created for adjusting the line length of the line 57a.

In FIG. 8B, a route modification is performed to create a bypass 62 that does not cross the via clearance zone 58 for the part of the line 57a that crosses the via clearance zone 58. In FIG. 8B, the meander section desires to be shortened to maintain the specified line length since the line length of the line 57a is extended due to the creation of the bypass 62.

However, since there is no meander section in line 57a, shortening cannot be performed to compensate for the amount of line extended due to the creation of the bypass 62. In the case where for some reason or other a meander section cannot be shortened, such as when no meander section is created, the line 57a cannot be shortened to compensate for the amount extended due to the creation of the bypass 62.

Therefore, as illustrated in FIG. 8B, the line 57b is extended by generating a meander section 63 in the line 57b that is isometric to line 57a to maintain the specified line length for the isometric lines 57a and 57b.

Figure 9:
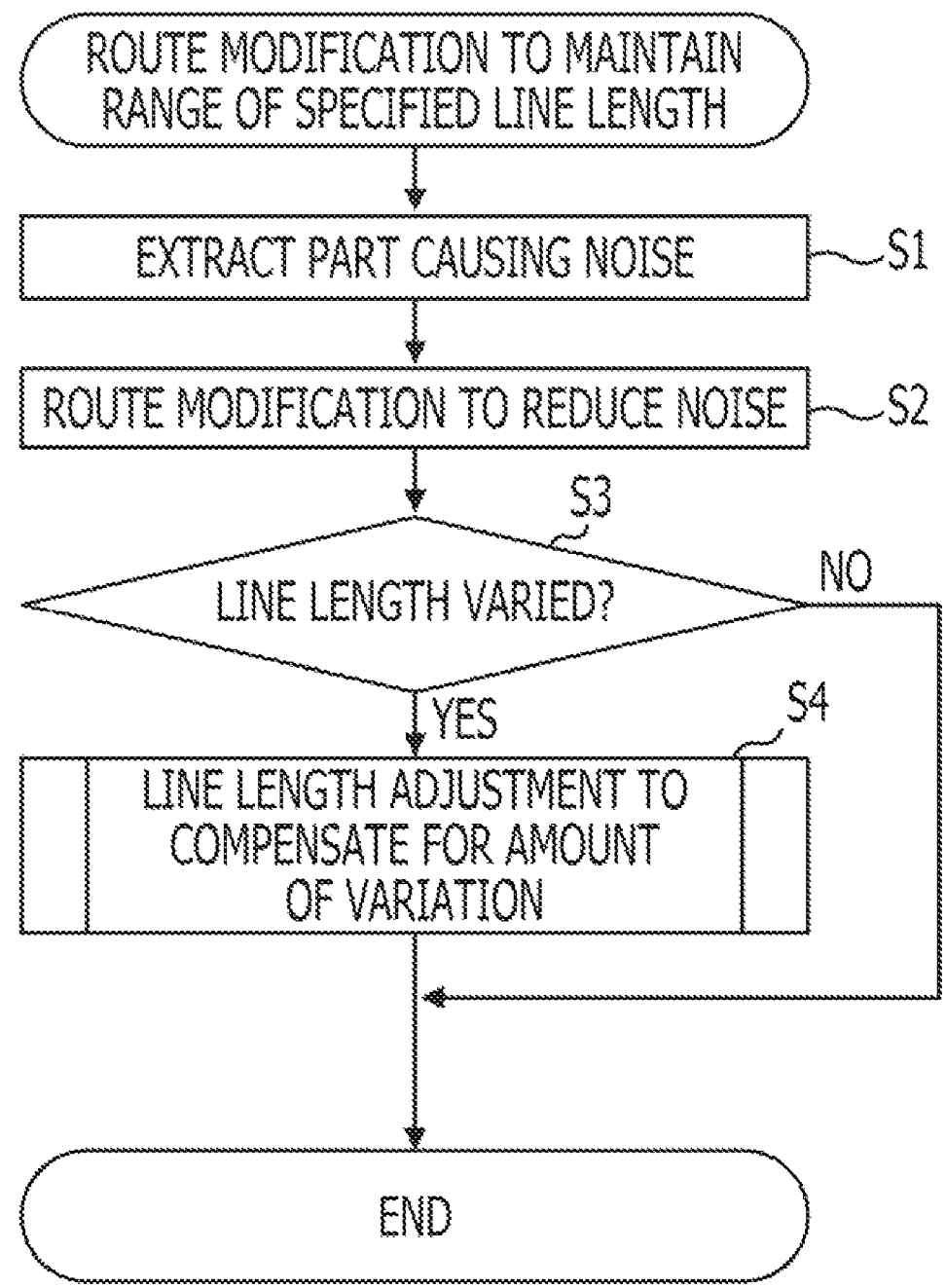
FIG. 9 is an example flowchart illustrating procedures for the route modification process and the line length adjusting process.

The route modification process and the line length adjusting process illustrated in FIGS. 7A and 7B and FIGS. 8A and 8B are, for example, conducted using the procedures illustrated in FIG. 9. FIG. 9 is an example flowchart representing procedures for the route modification process and the line length adjusting process. The route modification process and the line length adjusting process illustrated in FIGS. 7A and 7B are described as examples.

In step S1, the noise contamination part extracting unit 22 extracts the part of the line 57 that crosses the via clearance zone 58. The part of the line 57 is an example of the part on the line 57 under a condition where noise contaminates signals due to the route of the line 57 and the physical conditions around the line using the wiring design completed by the CAD function unit 21. The process to extract the part of the line 57 that crosses the via clearance zone 58 uses the pattern information 35 in the printed wiring board DB 25. The noise contamination part extracting unit 22 stores the part of the line 57 that crosses the via clearance zone 58 in, for example, the working data storage unit 26.

In step S2, the route modification processing unit 23 reduces the noise by making a route modification to create the bypass 62 that does not cross the via clearance zone 58 for the part of the line 57 that crosses the via clearance zone 58 stored in the working data storage unit 26. The process that conducts the route modification to create the bypass 62 that allows the part of the line 57 that crosses the via clearance zone 58 to avoid crossing the via clearance zone 58 uses and updates the component information 33 and the pattern information 35 of the printed wiring board DB 25. The route modification processing unit 23 stores the route modification to create the bypass 62 that avoids crossing the via clearance zone 58 in, for example, the working data storage unit 26.

In step S3, the line length adjusting unit 24 determines whether or not the line length was varied due to the route modification to create the bypass 62 that avoids crossing the via clearance zone 58 stored in the working data storage unit 26. From the example illustrated in FIGS. 7A and 7B, a variation in line length is determined from the extending of the line length due to the creation of the bypass 62 in line 57. After determining the variation of the line length, the line length adjusting unit 24 proceeds to step S4 and shortens the meander section 61 to cancel out the amount of variation caused by extending the line length due to the creation of the bypass 62 to maintain the specified line length, and then the procedures in the flowchart in FIG. 9 are finished. Conversely, if it is determined that no line length variation has occurred, the line length adjusting unit 24 does not conduct the process in step S4 and the procedures of the flowchart in FIG. 9 are finished. The procedures in steps S3 and S4 use and update the component information 33, the pattern information 35, and the wiring constraint information 36 of the printed wiring board DB 25.

Figure 10:
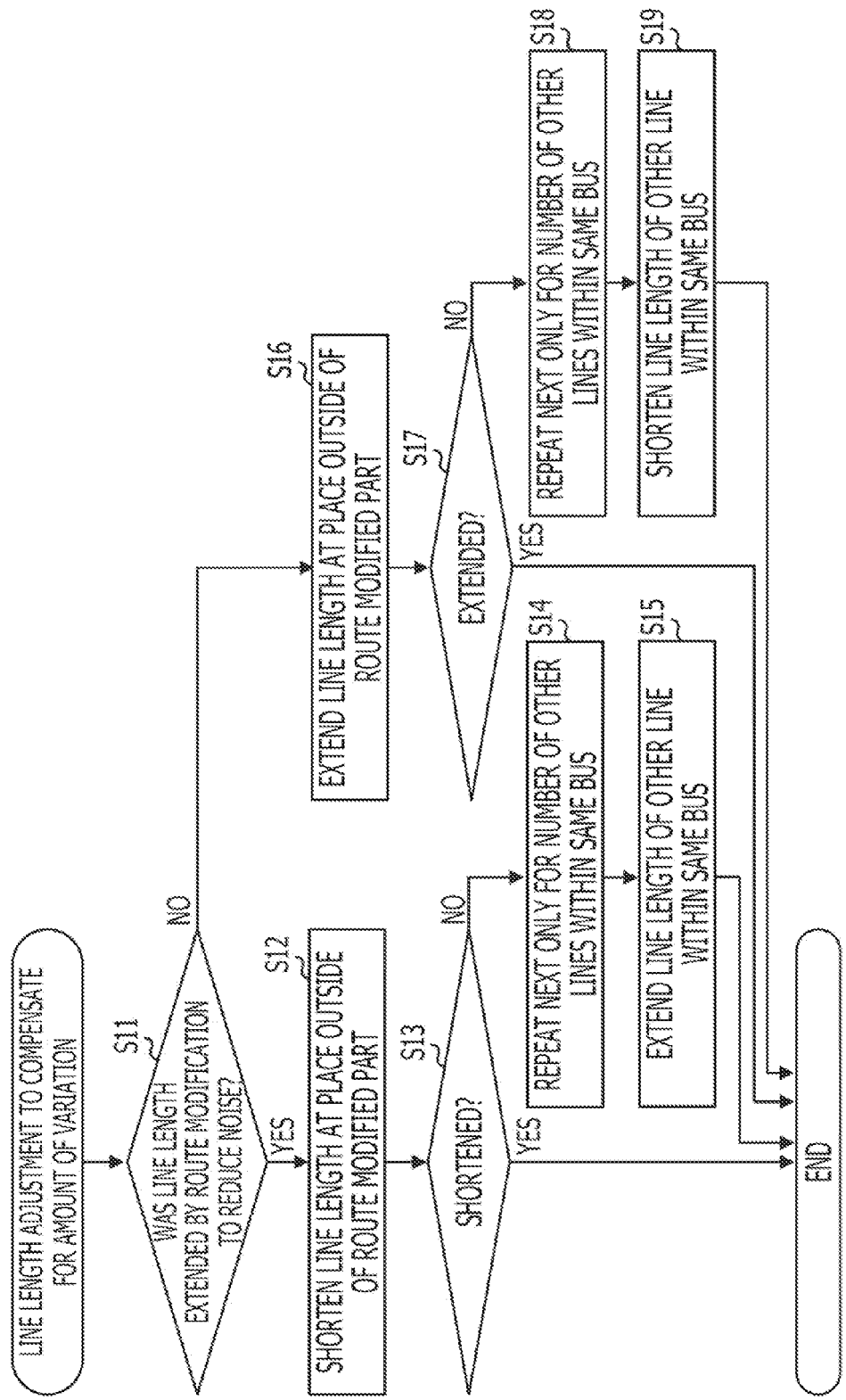
FIG. 10 is a detailed flowchart of the process in step S4.

FIG. 10 is a detailed flowchart of the process in step S4. In step S11, the line length adjusting unit 24 determines whether or not the line length was varied due to the route modification to create the bypass 62 that avoids crossing the via clearance zone 58 stored in the working data storage unit 26. Determining whether or not the line length was extended can be performed using a line length calculation function of the CAD function unit 21. From the example illustrated in FIGS. 7A and 7B, extending of the line length is determined from the creation of the bypass 62 on line 57.

When it is determined that the line length was extended, the line length adjusting unit 24 proceeds to step S12 and compensates for the amount of variation from the extending of the line length due to the creation of the bypass 62 by shortening the line length of a place outside of the bypass 62 that is the route modification part. In FIGS. 7A and 7B, the amount of variation of line extending due to the creation of the bypass 62 is compensated for by shortening the meander section 61. The line length shortening process is described in detail below.

In step S13, the line length adjusting unit 24 determines whether or not the line length at a place outside of the bypass 62 that is the route modification part is shortened only for the amount of variation of the line length extension due to the creation of the bypass 62 that can be compensated for. To compensate for the amount of variation of the line length extension due to the creation of the bypass 62 by shortening the meander section 61 in the example in FIGS. 7A and 7B, only for the amount of variation of the line length extension due to the creation of the bypass 62 that can be compensated for is determined to be the amount of line length shortened outside of the bypass 62 that is the route modification part.

When it is determined that the amount of variation of line length outside of the bypass 62 that is the route modification part is shortened by compensating only for the amount of the line length extension due to the creation of the bypass 62, the line length adjusting unit 24 finishes the procedures in the flowchart illustrated in FIG. 10.

If, in step S13, it is determined that the line length outside of the bypass 62 that is the route modification part is not shortened by only for the amount of variation of line length extension due to the creation of the bypass 62 that can be compensated for, the line length adjusting unit 24 advances to step S14 and repeats the process in step S15 by only for the number of other lines within the same bus as the line 57 (another line that is isometric with line 57).

In step S15, the amount of variation of extending the line length of line 57 due to the creation of the bypass 62 is compensated for by the line length adjusting unit 24 by creating, for example, a meander section in another line within the same bus and extending the line length. The process for extending the line length is described in detail below.

Furthermore, when it is determined that the line length is not extended in step S11, the line length adjusting unit 24 advances to step S16 to compensate for the amount of variation of shortening the line length due to the route modification to reduce noise, by extending the line length in a place outside of the route modification part. The process for extending the line length is described in detail below.

In step S17, the line length adjusting unit 24 determines whether or not the line length outside of the route modification part is extended, only for the amount of variation of line length shortened due to the route modification to reduce noise that can be compensated for. When it is determined that the line length outside of the route modification part was extended only for the amount of variation of line length that was shortened by the route modification to reduce noise that can be compensated for, the line length adjusting unit 24 finishes the procedures in the flowchart illustrated in FIG. 10. When, in step S17, it is determined that the line length outside of the route modification part is not extended only for the amount of variation of line length shortened by the route modification to reduce noise that can be compensated for, the line length adjusting unit 24 advances to step S18 and repeats the procedures in step S19 only for the number of other lines within the same bus as line 57. The line length adjusting unit 24 advances to step S19 and compensates for the amount of variation of line length shortened by the route modification to reduce noise by shortening the length of another line within the same bus. The line length shortening process is described in detail below.

Figure 11:
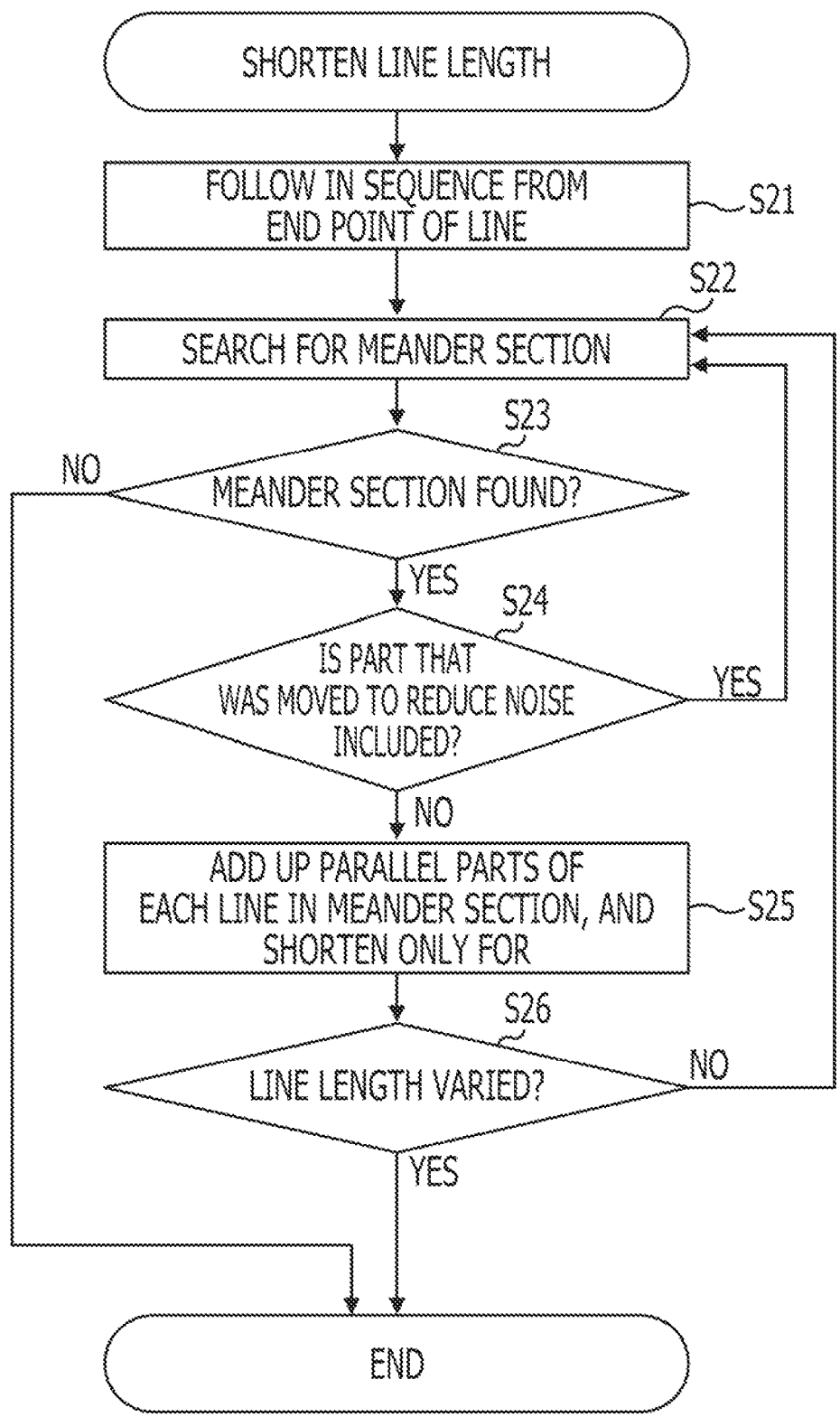
FIG. 11 is a detailed flowchart of a line length shortening process.

The process for shortening the line length from the flowchart in FIG. 10 is illustrated in the flowchart in FIG. 11. In step S21, the line length adjusting unit 24 reads the information of the line that was shortened from the pattern information 35 in the printed wiring board DB 25, and follows in sequence the line that was shortened from an end point.

In step S22, the line length adjusting unit 24 searches for a meander section along the line that was shortened. In step S23, the line length adjusting unit 24 determines whether or not there is a meander section along the line that was shortened. If it is determined that no meander section exists along the line that was shortened, the line length adjusting unit 24 finishes the procedures in the flowchart in FIG. 11. If it is determined that a meander section exists along the line that was shortened, the line length adjusting unit 24 advances to step S24 and determines whether or not the part that had a route modification to reduce noise is included in the meander section. Information on parts having undergone route modification to reduce noise is read out from the working data storage unit 26.

If the part that had the route modification to reduce noise is included in the meander section, the line length adjusting unit 24 returns to step S22. If the part that had a route modification to reduce noise is not included in the meander section, the line length adjusting unit 24 advances to step S25 and attempts to shorten the line to a target value by shortening parts of the line that run parallel in the meander section. In the example in FIGS. 7A and 7B, the amount of line extended due to the creation of the bypass 62 is compensated for through the shortening of the meander section 61.

In step S26, if it is determined that the shortened line was not shortened to the target value, the line length adjusting unit 24 returns to step S22. If it is determined that the line was shortened to the target value, the procedures in the flowchart in FIG. 11 are finished. The results of the line length adjusting process performed by the line length adjusting unit 24 are reflected in the printed wiring board DB 25.

Figure 12:
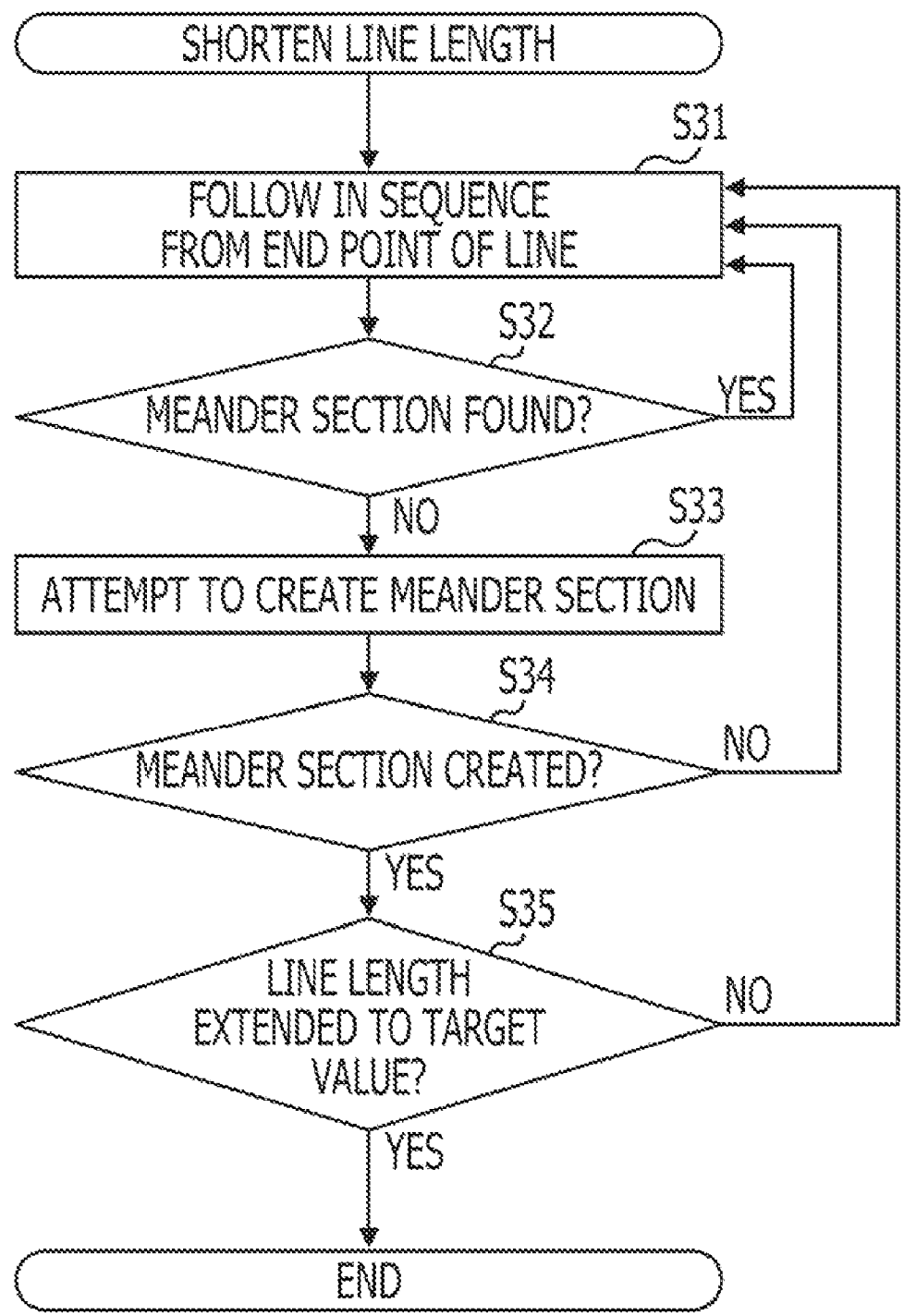
FIG. 12 is a detailed flowchart of a line length extending process.

The process for extending the line length from the flowchart in FIG. 10 is illustrated in the flowchart in FIG. 12. In step S31, the line length adjusting unit 24 reads the line information of the line that was extended from the pattern information 35 in the printed wiring board DB 25, and follows in sequence the line that was extended from an end point.

In step S32, the line length adjusting unit 24 determines whether or not there is a part where the route was modified to reduce noise. If there is a part where the route was modified to reduce noise, the line length adjusting unit 24 returns to step S31. If it is determined that there is no part where the route was modified to reduce noise, the line length adjusting unit 24 advances to step S33 and attempts to create a meander section. The creation of a meander section is conducted by using and updating the substrate information 31, the component information 33, and the pattern information 35 in the printed wiring board DB 25. In the example illustrated in FIGS. 8A and 8B, the line length of the line 57b is extended by creating the meander section 63 on the line 57b to compensate for the amount of variation of the line length that is extended on line 57a due to the creation of the bypass 62 on the line 57a.

In step S34, the line length adjusting unit 24 determines whether or not a meander section was created on the line that was extended. If it is determined that a meander section was not created on the line that was extended, the line length adjusting unit 24 returns to step S31. If it is determined that a meander section was created on the line that was extended, the line length adjusting unit 24 advances to step S35 to determine whether or not the line length of the line that was extended was extended to a target value.

If the line length of the extended line was not extended to the target value, the line length adjusting unit 24 returns to step S31. If it is determined that the line length of the extended line was extended to the target value, the line length adjusting unit 24 finishes the procedures in the flowchart illustrated in FIG. 12. The results of the line length adjusting process performed by the line length adjusting unit 24 are reflected in the printed wiring board DB 25.

Step S2 in FIG. 9 illustrates the route modification process. In the route modification process in step S2, a line route is modified by moving the part, extracted by the noise contamination part extracting unit 22 from the line route and the physical condition around the line, on the line with the condition where noise contaminates signals, to a position that avoids the condition where noise contaminates signals.

For example, in the example illustrated in FIGS. 7A and 7B, the part of the line 57 crossing the via clearance zone 58 is an example of a part on the line 57 in a condition where noise contaminates a signal due to the line 57 route and physical conditions around the line 57. Here, as an example of the route modification process, an example of modifying the route of line 57 by moving the part of the line 57 that crosses the via clearance zone 58 to a position that avoids conditions where signals are contaminated by noise will be described.

Figure 13:
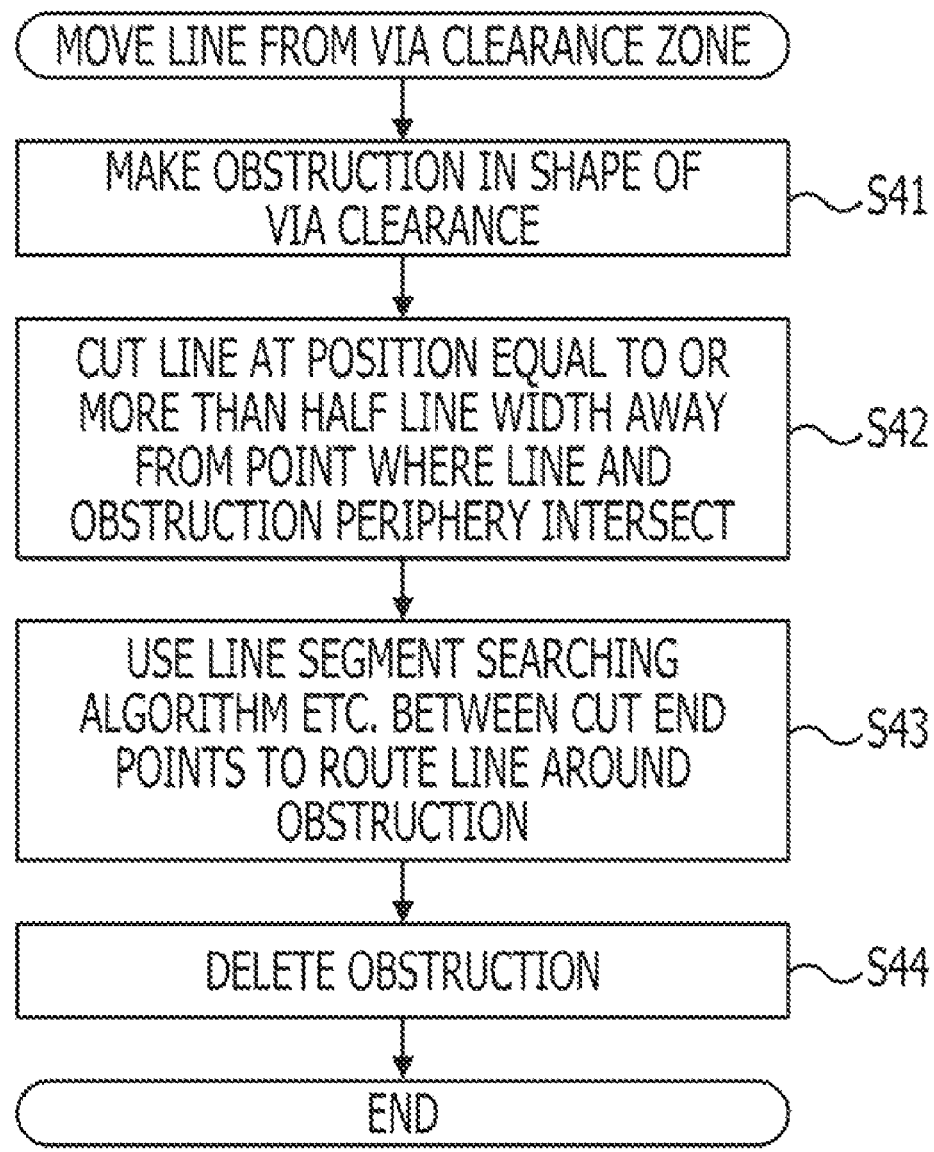
FIG. 13 is a detailed flowchart of the process in step S2.
Figure 14A:
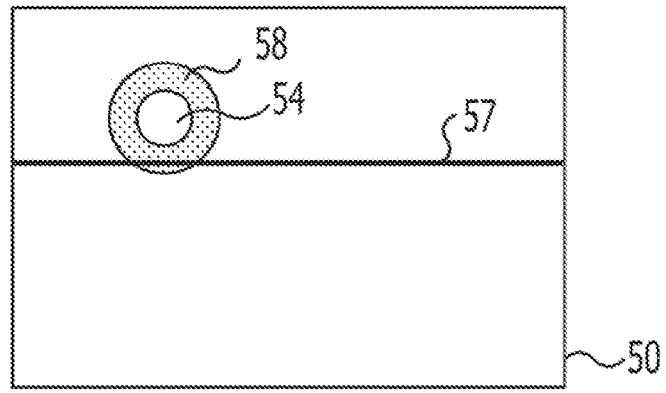
FIGS. 14A to 14C are images of the process of step S2.
Figure 14B:
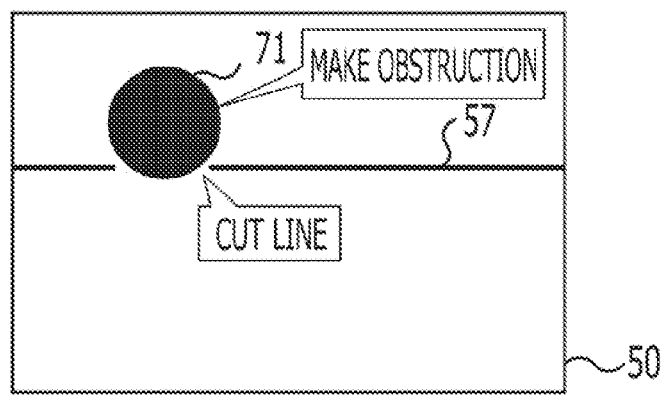
Figure 14C:
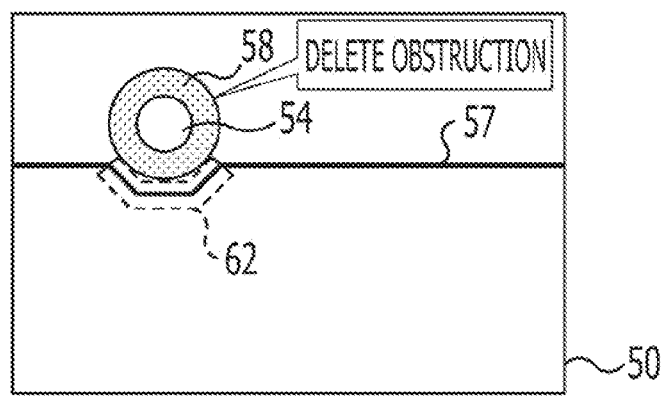

FIG. 13 is a flowchart describing details of the step S2 process for handling the part of a line that crosses a via clearance zone. FIGS. 14A to 14C illustrate the step S2 process for handling the part of a line that crosses a via clearance zone.

As illustrated in FIG. 14A, the line 57 crosses the via clearance zone 58. In step S41, the route modification processing unit 23 temporarily places an obstruction 71 with a shape that corresponds to the shape of the via clearance zone 58 on the via clearance zone 58 part as illustrated in FIG. 14B. The obstruction 71 may be anything such as a component that can be temporarily placed on the via clearance zone 58 part so that the line 57 cannot be routed through that part. The route modification processing unit 23 stores information on the obstruction 71 in the working data storage unit 26 for example.

In step S42, the route modification processing unit 23 cuts the line 57 at a position that is at least half of the width of the line 57 away from an intersection point where the line 57 and the periphery of the obstruction 71 intersect. The route modification processing unit 23 deletes the part of the line 57 on the obstruction 71.

In step S43, the route modification processing unit 23 uses a well-known line segment searching algorithm (shortest routing) between the end points of the cut line 57 to conduct routing to create the bypass 62 to bypass the obstruction 71 as illustrated in FIG. 14C. In step S44, the route modification processing unit 23 deletes the obstruction 71 and finishes the procedures of the flowchart illustrated in FIG. 13. The results of the route modification process conducted by the route modification processing unit 23 are reflected in the printed wiring board DB 25.

ILLUSTRATIVE EXAMPLE 2

Figure 15B:
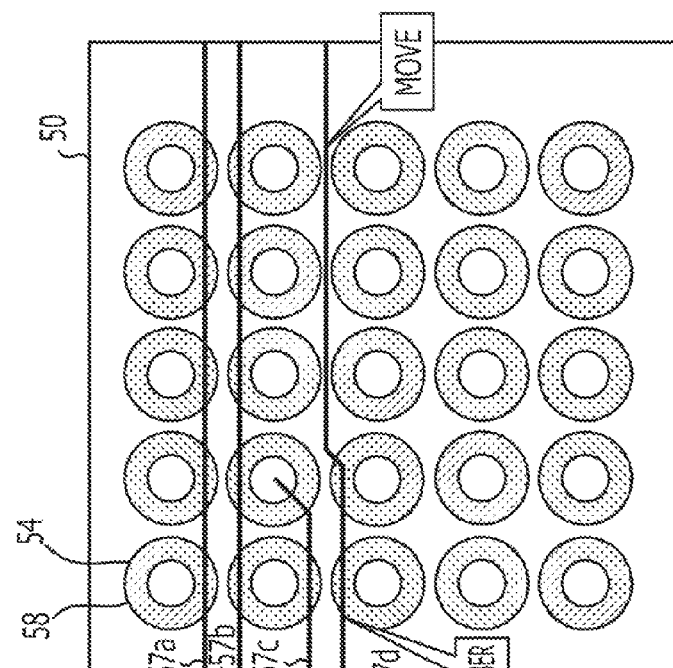
FIGS. 15A and 15B illustrate another example of the route modification process.
Figure 15A:
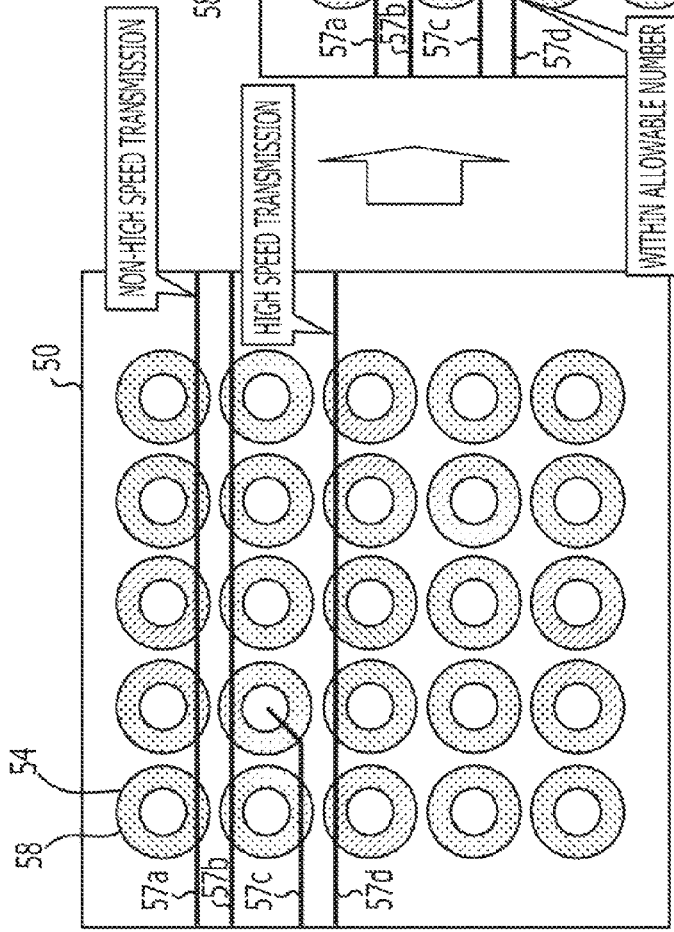

FIGS. 15A and 15B illustrates another example of the route modification process. The line length adjusting process is substantially the same as the first illustrative example and the description will be omitted. FIGS. 15A and 15B are transparent views of the printed wiring board 50 seen from above. In FIG. 15A, the lines 57a to 57d cross via clearance zones 58. Hereinafter, the term "line 57" will be used generically when referring to any of the lines.

FIG. 15A illustrates vias 54 and lines 57 below a typical ball grid array (BGA). Furthermore, two lines 57 are passing between the vias 54. Lines 57a and 57b conduct non-high speed transmission. Lines 57c and 57d conduct high speed transmission.

In FIG. 15B, route modifications are not conducted for the parts of the non-high speed lines 57a and 57b that cross via clearance zones 58 since the effect from noise is at an acceptable level. Route modifications are conducted to avoid crossing via clearance zones 58 for areas of the lines 57c and 57d that cross via clearance zones 58 after the lines 57c and 57d have crossed an allowable number of via clearance zones 58.

The allowable number is decided based on the transmission speed of the lines 57. The allowable number is preset as the "allowable number of via clearance zone crossings" in the wiring constraint information 36 in the printed wiring board DB 25. When the route modification process in FIGS. 15A and 15B is conducted manually by a user, all of the parts are often revised since it will be too much trouble to check whether or not the allowable number has been exceeded while working. As a result, an excessive amount of revisions are conducted and many wasted man-hours are created when the routing modification process is conducted manually by a user.

In the route modification process according to the illustrative example of the present embodiments, excessive route modification can be substantially prevented by conducting route modifications to avoid crossing via clearance zones 58 after the allowable number of via clearance zones 58 have been crossed.

The route modification process illustrated in FIGS. 15A and 15B is, for example, conducted using the procedures illustrated in the flowchart in FIG. 16. FIG. 16 is another example flowchart illustrating procedures for the route modification process. The route modification process illustrated in FIGS. 15A and 15B is described as an example.

In step S51, the route modification processing unit 23 stores, as described below, the information of the via 54 that has a line 57 crossing the via clearance zone 58, in the working data storage unit 26 as "crossed via clearance zone via information" 41 for each line.

In step S52, the route modification processing unit 23 refers to the "crossed via clearance zone via information" 41 for each line in the working data storage unit 26 and repeats the following processes only for the number of vias 54 that have lines 57 crossing the via clearance zones 58.

In step S53, the route modification processing unit 23 determines whether or not the number of crossed via clearance zones 58 of the net having the line 57 that crosses the via clearance zone 58 exceeds an "allowable number of via clearance zone crossings" for each of the vias 54.

If the "allowable number of via clearance zone crossings" is not exceeded, the route modification processing unit 23 returns to step S52. If the "allowable number of via clearance zone crossings" is exceeded, the route modification processing unit 23 advances to step S54 and conducts route modification so that the line 57 does not cross the via clearance zone 58.

For example, FIGS. 15A and 15B illustrate an example where the "allowable number of via clearance zone crossings" for line 57d is 2. Therefore, after the line 57d in FIG. 15A crosses 2 via clearance zones 58, route modification is conducted so that the third and following via clearance zones 58 are not crossed. The results of the route modification process conducted by the route modification processing unit 23 are reflected in the printed wiring board DB 25.

Figure 17:
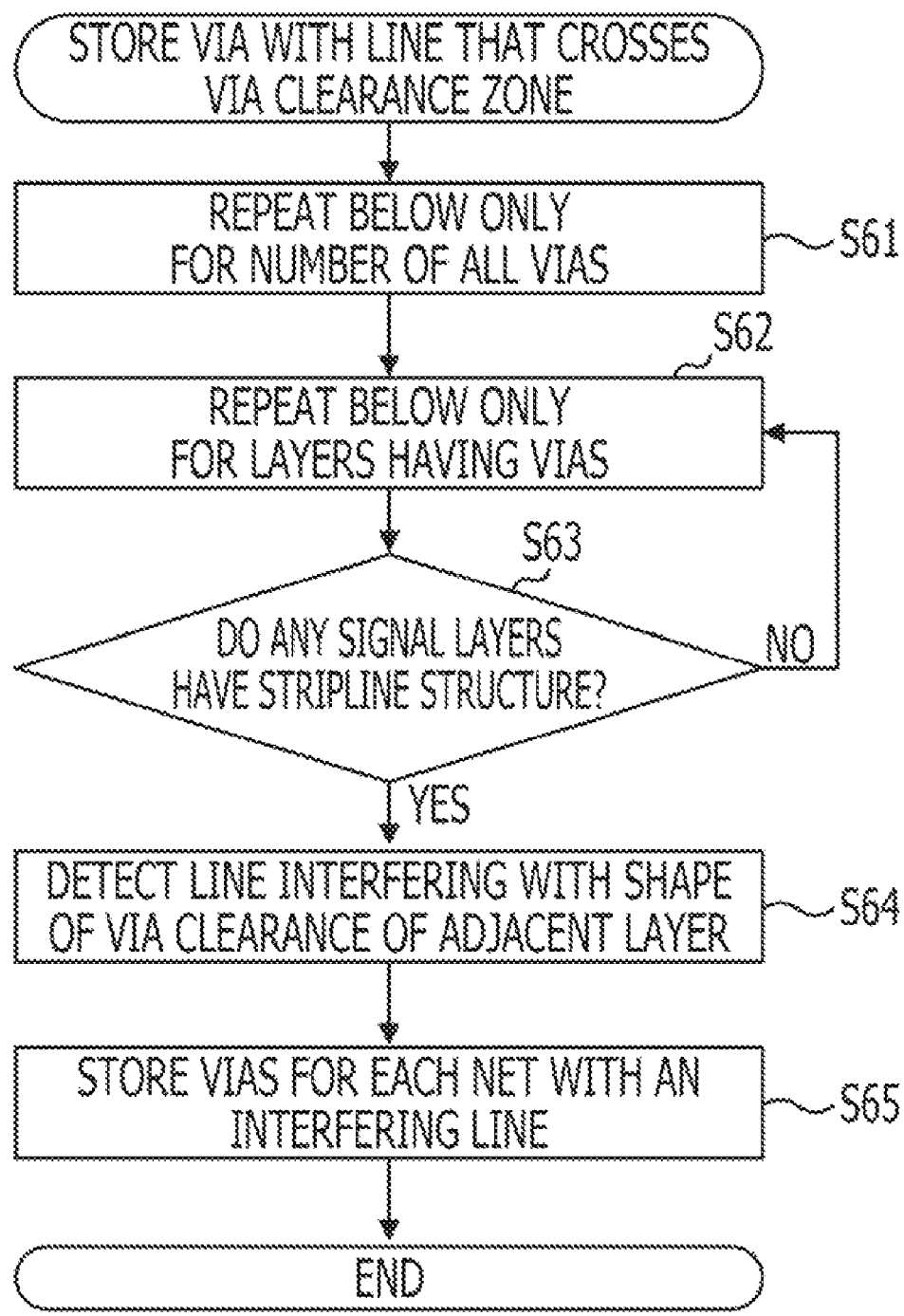
FIG. 17 is a detailed flowchart of the process in step S51.

The process in step S51 is conducted for example as illustrated in FIG. 17. FIG. 17 is a detailed flowchart of the process in step S51. In step S61, the route modification processing unit 23 repeats the following process for the number of all the vias 54. In step S62, the route modification processing unit 23 repeats the following process for the number of layers that have vias 54.

In step S63, the route modification processing unit 23 determines whether or not the layers that have vias 54 are signal (wiring) layers with stripline structures. If it is determined that the layer that has the via 54 is not a signal layer with a stripline structure, the route modification processing unit 23 returns to step S62. If it is determined that the layer that has the via 54 is a signal layer with a stripline structure, the route modification processing unit 23 advances to step S64 to detect a line 57 that interferes with a shape of a via clearance of an adjacent layer.

In step S65, the route modification processing unit 23 stores the vias 54 as "crossed via clearance zone via information" 41 for each line in the working data storage unit 26 for each net that has a line 57 (interfering line) detected in step S64.

ILLUSTRATIVE EXAMPLE 3

Figure 18A:
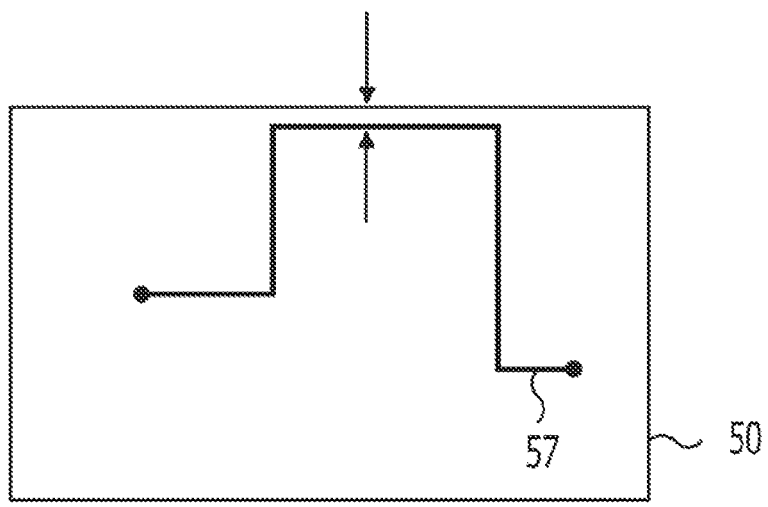
FIGS. 18A and 18B illustrate another example of the route modification process.
Figure 18B:
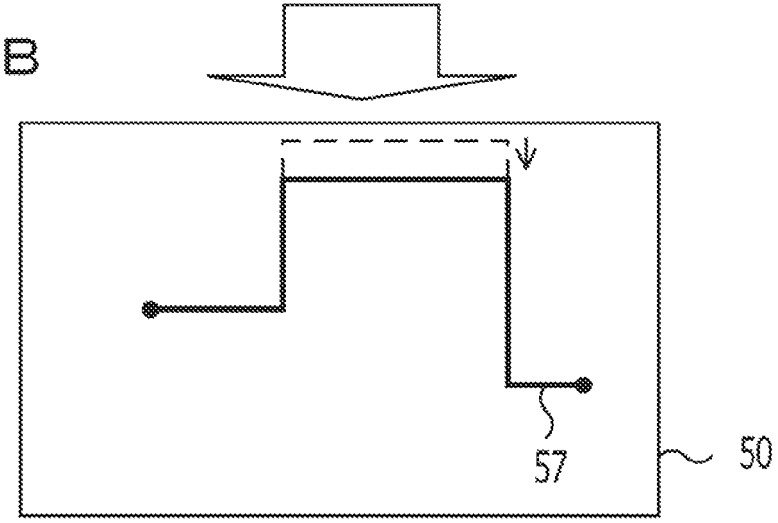

FIGS. 18A and 18B illustrate another example of the route modification process. The line length adjusting process is substantially the same as the first illustrative example and the description will be omitted. FIGS. 18A and 18B are transparent views of the printed wiring board 50 as seen from above. In FIG. 18A, the line 57 is routed near a power source (ground) plane pattern periphery. The part of the line 57 crossing near the power source (ground) plane pattern periphery is an example of a part on the line 57 in a condition where noise contaminates a signal due to the line 57 route and physical conditions around the line 57.

The CAD device 1 of the illustrative example of the present embodiments conducts route modification of the line 57 by moving the part of the line 57 that crosses near the power source (ground) plane pattern periphery to a position that avoids a condition where noise contaminates the signals, in other words to a position where the line 57 does not cross near the power source (ground) plane pattern periphery. "Desired distance between plane pattern periphery and line" that is preset in the wiring constraint information 36 in the printed wiring board DB 25 is used to determine whether or not a line is near a power source (ground) plane pattern periphery.

In FIG. 18B, a route modification is conducted on the part of the line 57 that crosses near the power source (ground) plane pattern periphery to a position that is at least a certain distance away, the certain distance being the "desired distance between the plane pattern periphery and the line" preset in the wiring constraint information 36 in the printed wiring board DB 25.

Figure 19:
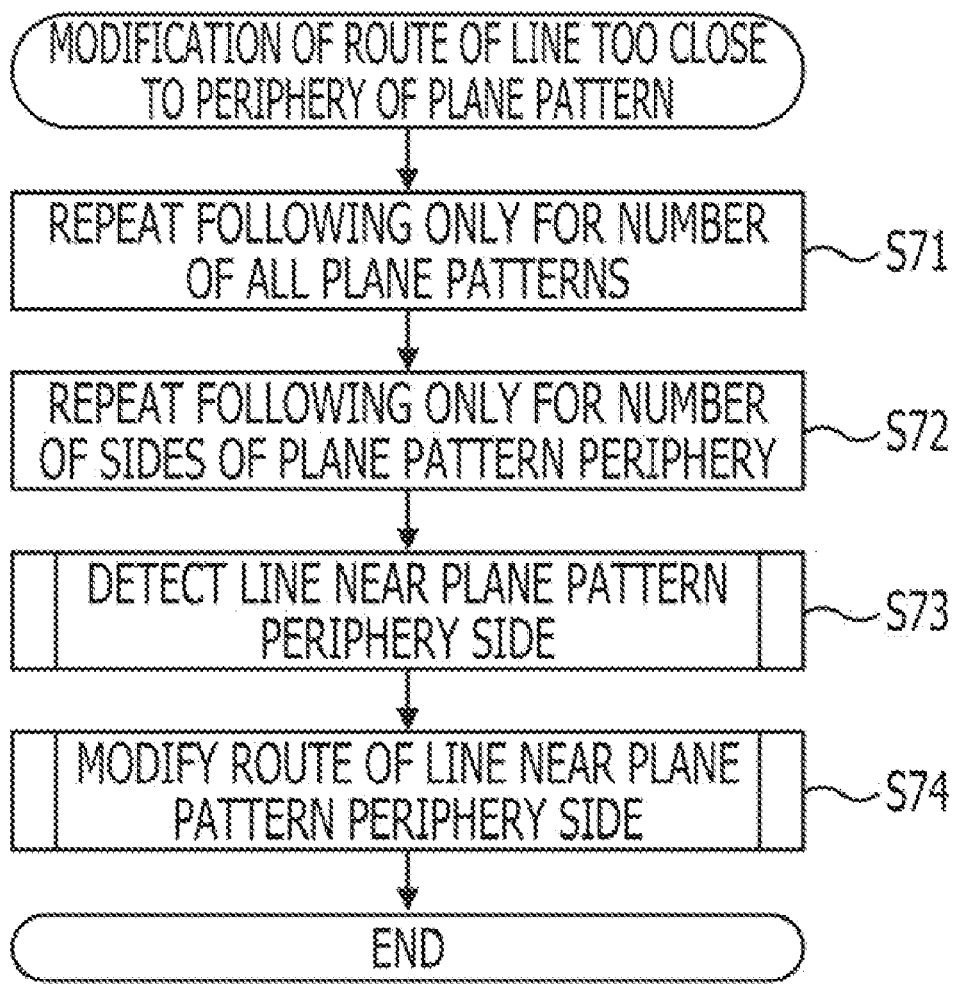
FIG. 19 is another example flowchart illustrating procedures for the route modification process.

The route modification process illustrated in FIGS. 18A and 18B is, for example, conducted using the procedures illustrated in the flowchart in FIG. 19. FIG. 19 is another example flowchart of procedures in the route modification process. The route modification process illustrated in FIGS. 18A and 18B is described as an example.

In step S71, the route modification processing unit 23 reads out information of the plane pattern from the pattern information 35 in the printed wiring board DB 25 and repeats the following processes only for the number of all the plane patterns. In step S72, the route modification processing unit 23 reads out information of the plane pattern from the pattern information 35 in the printed wiring board DB 25 and repeats the following processes only for the number of sides the plane pattern peripheries.

In step S73, the route modification processing unit 23 detects a line 57 near a side of the plane pattern periphery as described below. In step S74, the route modification processing unit 23 conducts route modification by moving the line 57 near the side of the plane pattern periphery a certain distance away from the side of the plane pattern periphery, the certain distance being the "desired distance between the plane pattern periphery and the line" preset in the wiring constraint information 36 in the printed wiring board DB 25. The results of the route modification process conducted by the route modification processing unit 23 are reflected in the printed wiring board DB 25.

Figure 20:
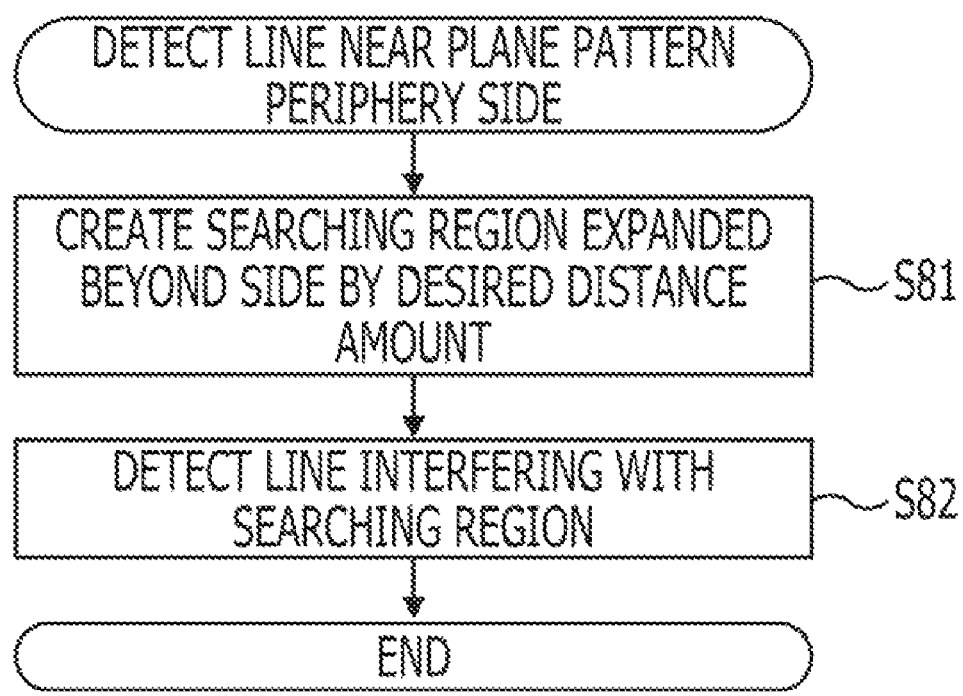
FIG. 20 is a detailed flowchart of the process in step S73.

FIG. 20 is a flowchart of the details of the process conducted in step S73. FIG. 20 is a detailed flowchart of the process in step S73. In step S81, the route modification processing unit 23 creates a searching region that is expanded beyond the side of the plane pattern periphery only for an amount of the "desired distance between the plane pattern periphery and the line" preset in the wiring constraint information 36 in the printed wiring board DB 25. The information of the created searching region is stored in, for example, the working data storage unit 26.

In step S82, the route modification processing unit 23 uses the pattern information 35 in the printed wiring board DB 25 to detect a line 57 that interferes with the searching region. Information on the detected line is stored, for example, in the working data storage unit 26.

Figure 21:
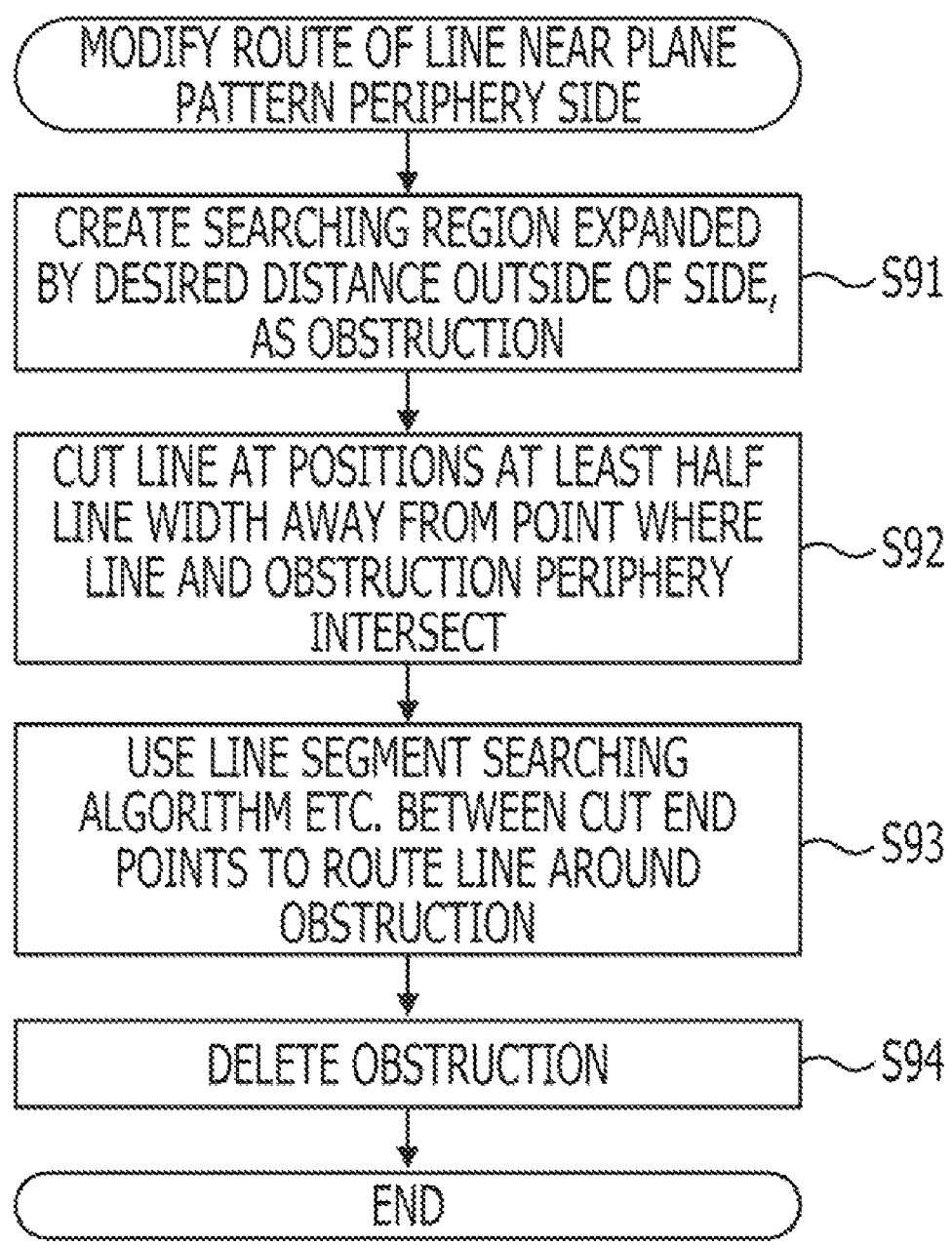
FIG. 21 is a detailed flowchart of the process in step S74.
Figure 22A:
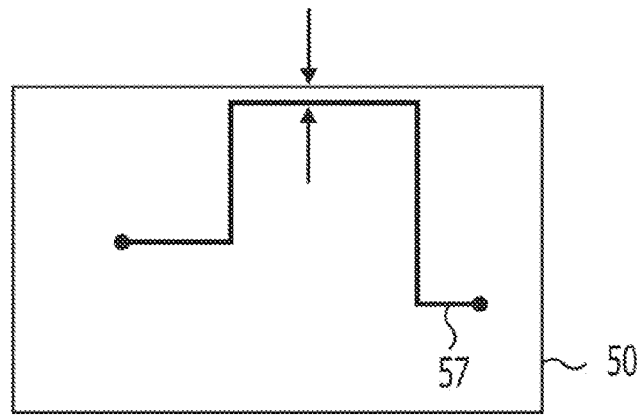
FIGS. 22A to 22C are images of the process of step S74.
Figure 22B:
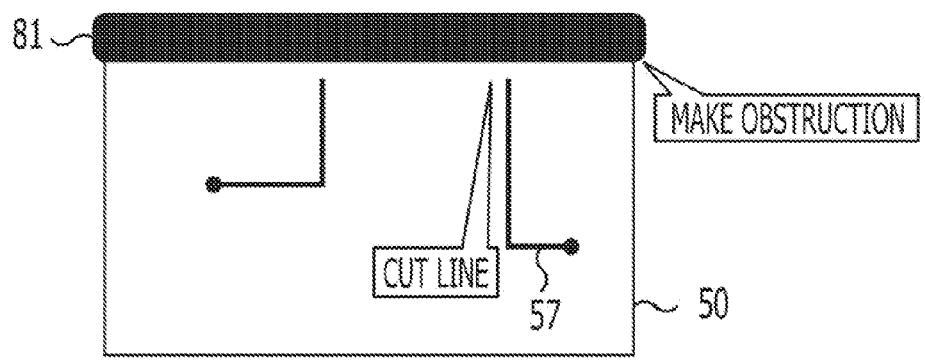
Figure 22C:
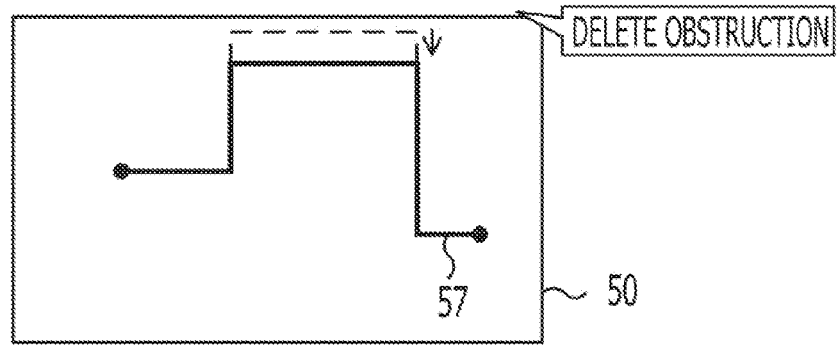

FIG. 21 is a flowchart of the details of the process conducted in step S74. FIG. 21 is a detailed flowchart of the process in step S74. FIGS. 22A to 22C illustrate images of the process of step S74.

As illustrated in FIG. 22A, the line 57 crosses near the side of the plane pattern periphery. In other words, the line 57 crosses closer to the side of the plane pattern periphery than the "desired distance between the plane pattern periphery and the line" preset in the wiring constraint information 36 in the printed wiring board DB 25.

In step S91, the route modification processing unit 23 temporarily places an obstruction 81 with a shape corresponding to the region that is expanded beyond the side of the plane pattern periphery only for the amount of the "desired distance between the plane pattern periphery and the line" preset in the wiring constraint information 36 in the printed wiring board DB 25, as illustrated in FIG. 22B. The route modification processing unit 23 stores information on the obstruction 81 in, for example, the working data storage unit 26.

In step S92, the route modification processing unit 23 cuts the line 57 at a position that is at least half of the width of the line 57 away from an intersection point where the line 57 and the periphery of the obstruction 81 intersect, as illustrated in FIG. 22B. The route modification processing unit 23 deletes the part of the line 57 on the obstruction 81.

In step S93, the route modification processing unit 23 uses a well-known line segment searching algorithm (shortest routing) between the end points of the cut line 57 to conduct routing to bypass the obstruction 81. In step S94, the route modification processing unit 23 deletes the obstruction 81 and finishes the procedures of the flowchart illustrated in FIG. 21. The results of the route modification process conducted by the route modification processing unit 23 are reflected in the printed wiring board DB 25.

ILLUSTRATIVE EXAMPLE 4

Figure 23:
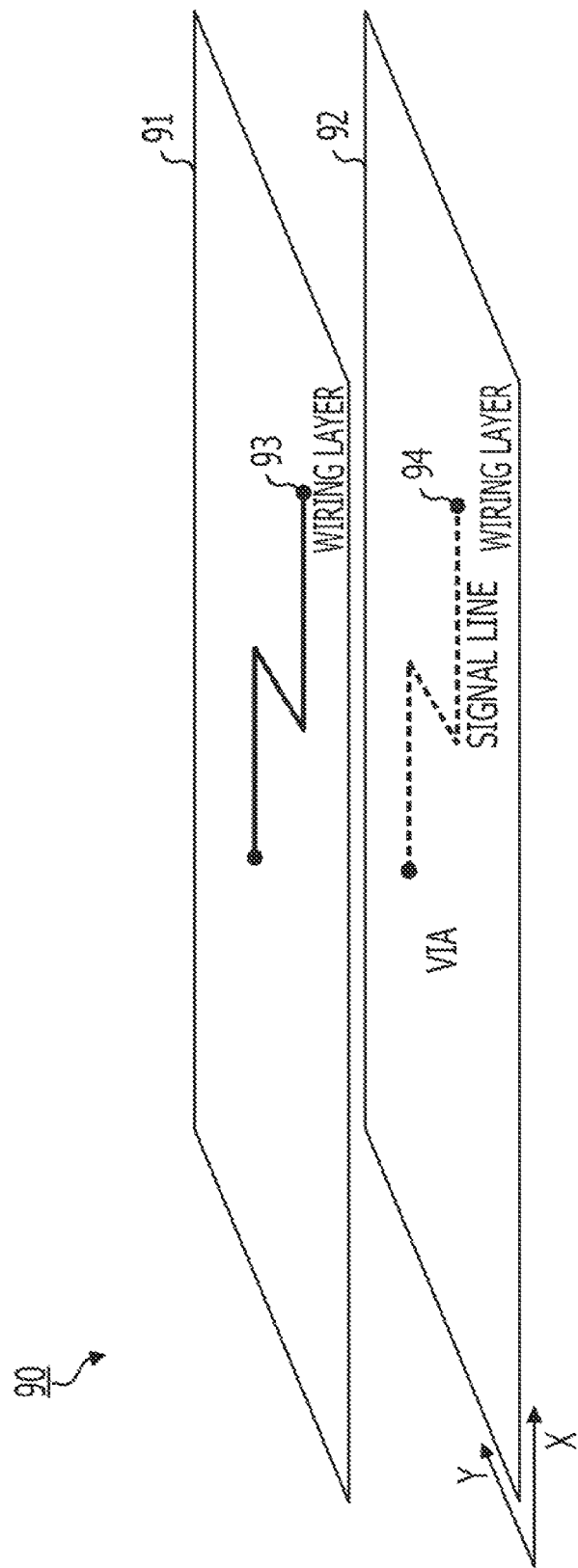
FIG. 23 is an example of a configuration indicating a printed wiring board layer structure that has multiple conductive layers while conducting wiring design.

FIG. 23 is an example of a configuration illustrating a printed wiring board layer structure that has multiple conductive layers while conducting wiring design. The layer structure of a printed wiring board 90 in FIG. 23 has adjacent wiring layers 91 and 92. The wiring layer 91 is routed with line 93. The wiring layer 92 is routed with line 94.

The route of the line 93 routed in wiring layer 91 overlaps the line 94 routed in the adjacent wiring layer 92 when viewed from the X and Y axes. The following description assumes that the figures are viewed from the X and Y axes. Interlayer crosstalk occurs due to the overlapping of the lines 93 and 94 routed in the adjacent wiring layers 91 and 92.

Parts of the lines 93 and 94 with overlapping routes on the adjacent wiring layers 91 and 92 are examples of parts of the lines 93 and 94 that have conditions where noise contaminates signals due to the routes of the lines 93 and 94 and physical conditions near the lines 93 and 94.

The CAD device 1 of the illustrative example of the present embodiments moves the parts of the lines 93 and 94 with overlapping routes in the adjacent wiring layers 91 and 92 to positions that avoid conditions where signals are contaminated by noise by conducting route modification of the lines 93 and 94 to substantially prevent overlapping of the routes.

Figure 24A:
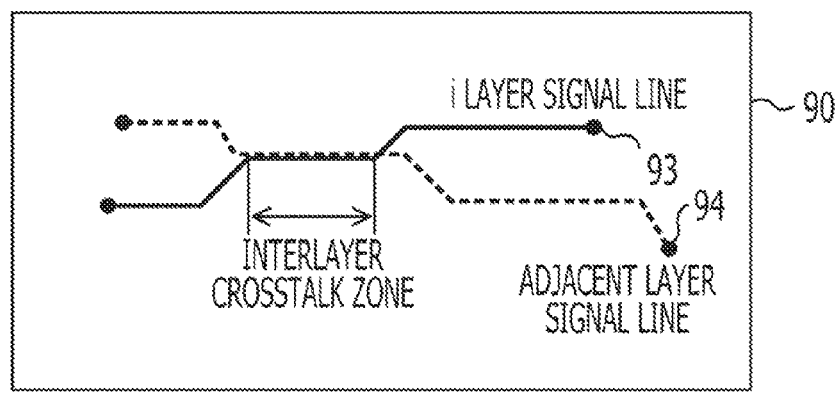
FIGS. 24A and 24B illustrate another example of the route modification process.
Figure 24B:
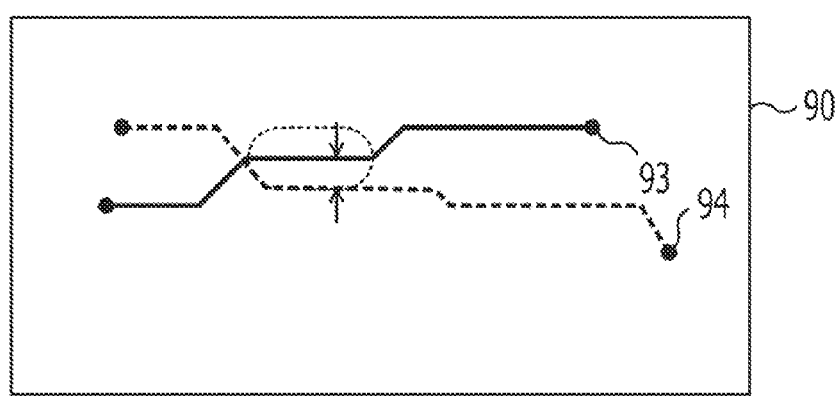

FIGS. 24A and 24B illustrate another example of the route modification process. The line length adjusting process is substantially the same as the first illustrative example and the description will be omitted. FIGS. 24A and 24B are transparent views of a printed wiring board 90 as seen from above. In FIG. 24A, a part of the route of line (signal line) 93 routed on wiring layer i and a part of the route of line 94 routed on a wiring layer (hereinafter called the adjacent layer) adjacent to the wiring layer i overlap each other. The overlapping parts of lines 93 and 94 are an interlayer crosstalk zone that produces interlayer crosstalk.

In FIG. 24B, a route modification is conducted in the interlayer crosstalk zone by moving the lines 93 and 94 that run parallel to each other between layers and exceed the allowable length of interlayer crosstalk, to a parallel line gap position that can avoid interlayer crosstalk. The allowable length of interlayer crosstalk is preset as the "allowable length of interlayer crosstalk" in the wiring constraint information 36 in the printed wiring board DB 25. The parallel running distance of the lines 93 and 94 can be realized by a function to calculate the parallel running distance of lines in the CAD function unit 21.

Furthermore, a parallel line gap wide enough to avoid interlayer crosstalk is preset in the wiring constraint information 36 in the printed wiring board DB 25 as an "interlayer crosstalk avoidance parallel line gap." A parallel line gap position that can avoid interlayer crosstalk can be realized by a function to calculate the gap between lines in the CAD function unit 21.

FIG. 24B illustrates an example where the allowable length of interlayer crosstalk is "0." Route modification is conducted in the interlayer crosstalk zone by moving the parts of the lines 93 and 94 that run parallel to each other between layers and exceed the interlayer crosstalk allowable length when the length of interlayer crosstalk is a value that exceeds "0", to the parallel line gap position that can avoid interlayer crosstalk. The route modification process according to the illustrative example of the present embodiments can substantially prevent excessive route modification by moving only for the amount that exceeds the interlayer crosstalk allowable length to a parallel line gap position that can avoid interlayer crosstalk.

Figure 25:
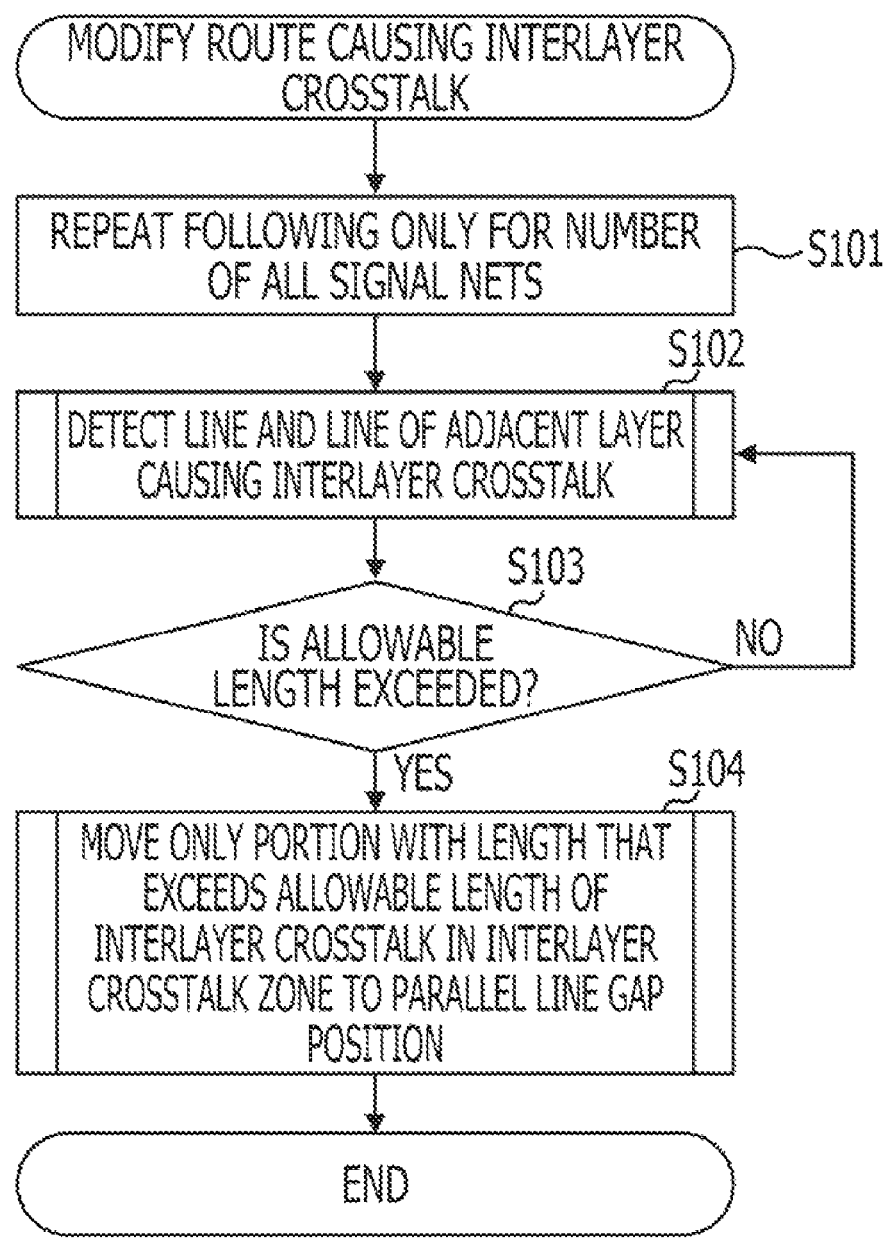
FIG. 25 is another example flowchart illustrating procedures for the route modification process.

The route modification process illustrated in FIGS. 24A and 24B are, for example, conducted using the procedures illustrated in the flowchart in FIG. 25. FIG. 25 is another example flowchart representing procedures for the route modification process. The route modification process illustrated in FIGS. 24A and 24B is described as an example.

In step S101, the route modification processing unit 23 reads out information on the lines from the pattern information 35 in the printed wiring board DB 25 and repeats the following processes only for the number of all the nets (signal nets). In step S102, the route modification processing unit 23 detects a line 94 routed in an adjacent wiring layer with a route that overlaps a line 93 routed in a wiring layer i, as the line 94 routed in the adjacent layer causing interlayer crosstalk. The route modification processing unit 23 records the information of the interlayer crosstalk zones in which the routes of the line 93 and the line 94 overlap as "interlayer crosstalk producing line zone i versus line zone j information" in the working data storage unit 26.

In step S103, the route modification processing unit 23 determines whether or not the interlayer crosstalk zone exceeds the allowable length of single layer crosstalk. The route modification processing unit 23 returns to step S102 if the interlayer crosstalk zone does not exceed the allowable length of single layer crosstalk.

If the interlayer crosstalk zone exceeds the allowable length of single layer crosstalk, the route modification processing unit 23 advances to step S104 and moves only the portion that exceeds the allowable length of single layer crosstalk to the parallel line gap position. The results of the route modification process conducted by the route modification processing unit 23 are reflected in the printed wiring board DB 25.

Figure 26:
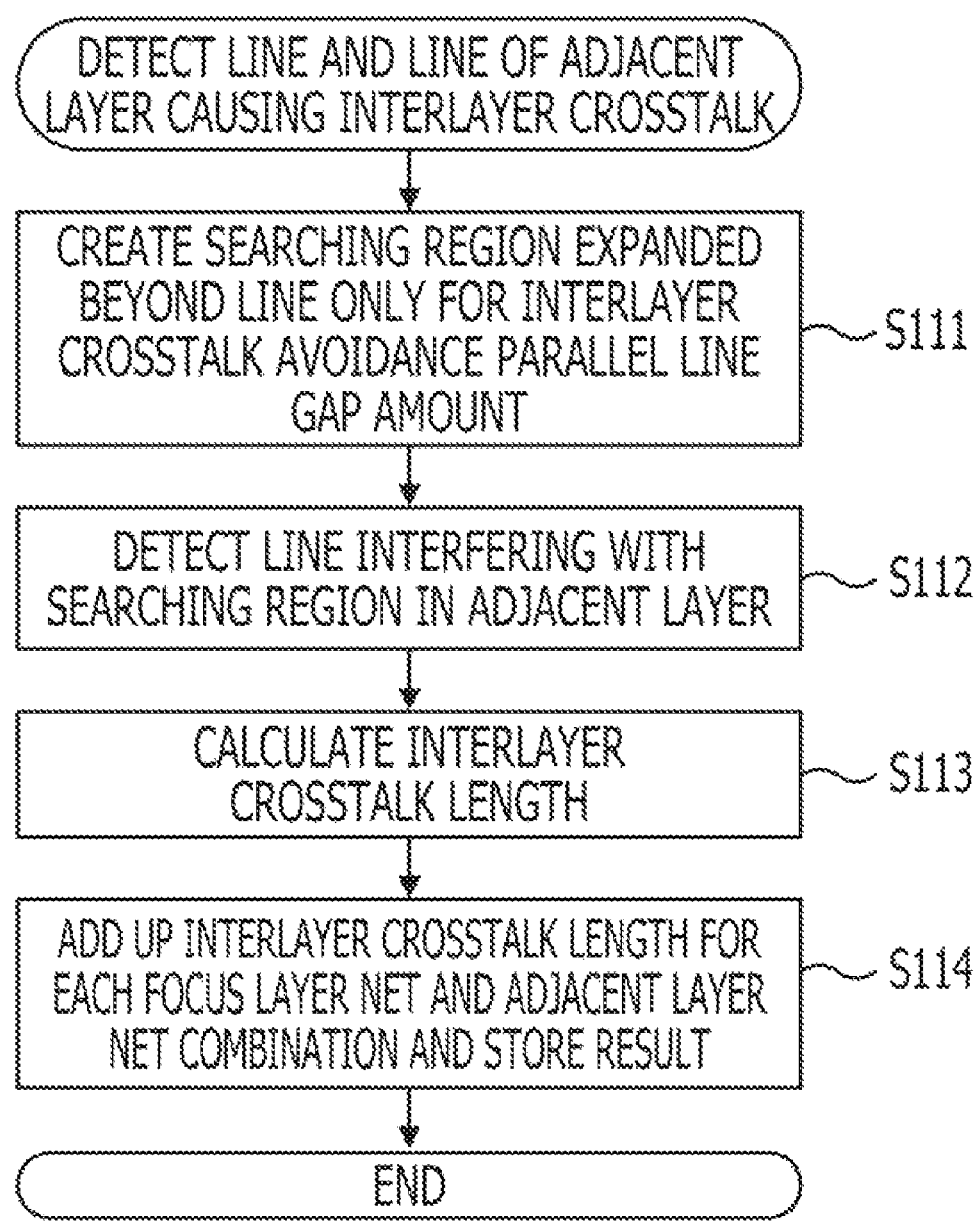
FIG. 26 is a detailed flowchart of the process in step S102.

For example, FIG. 26 illustrates the process conducted in step S102. FIG. 26 is a detailed flowchart of the process in step S102. In step S111, the route modification processing unit 23 creates a searching region that is expanded beyond the line 93 that is routed in the wiring layer i only for an "interlayer crosstalk avoidance parallel line gap" amount preset in the wiring constraint information 36 in the printed wiring board DB 25.

In step S112, the route modification processing unit 23 uses the pattern information 35 in the printed wiring board DB 25 to detect a line 94 that interferes with the searching region in the adjacent layer. In step S113, the route modification processing unit 23 calculates the length of the interlayer crosstalk zone (interlayer crosstalk length) in which the routes of the lines 93 and 94 overlap. The interlayer crosstalk length can be calculated by a function to calculate the parallel running distance of lines in the CAD function unit 21.

In step S114, the route modification processing unit 23 adds up the interlayer crosstalk length for each focus net and adjacent layer net combination, and stores the result as "interlayer crosstalk producing line zone i versus line zone j information" in the working data storage unit 26. Specifically, the interlayer crosstalk length of the lines 93 and 94 is stored as "interlayer crosstalk producing line zone i versus line zone j information" in the working data storage unit 26.

Figure 27:
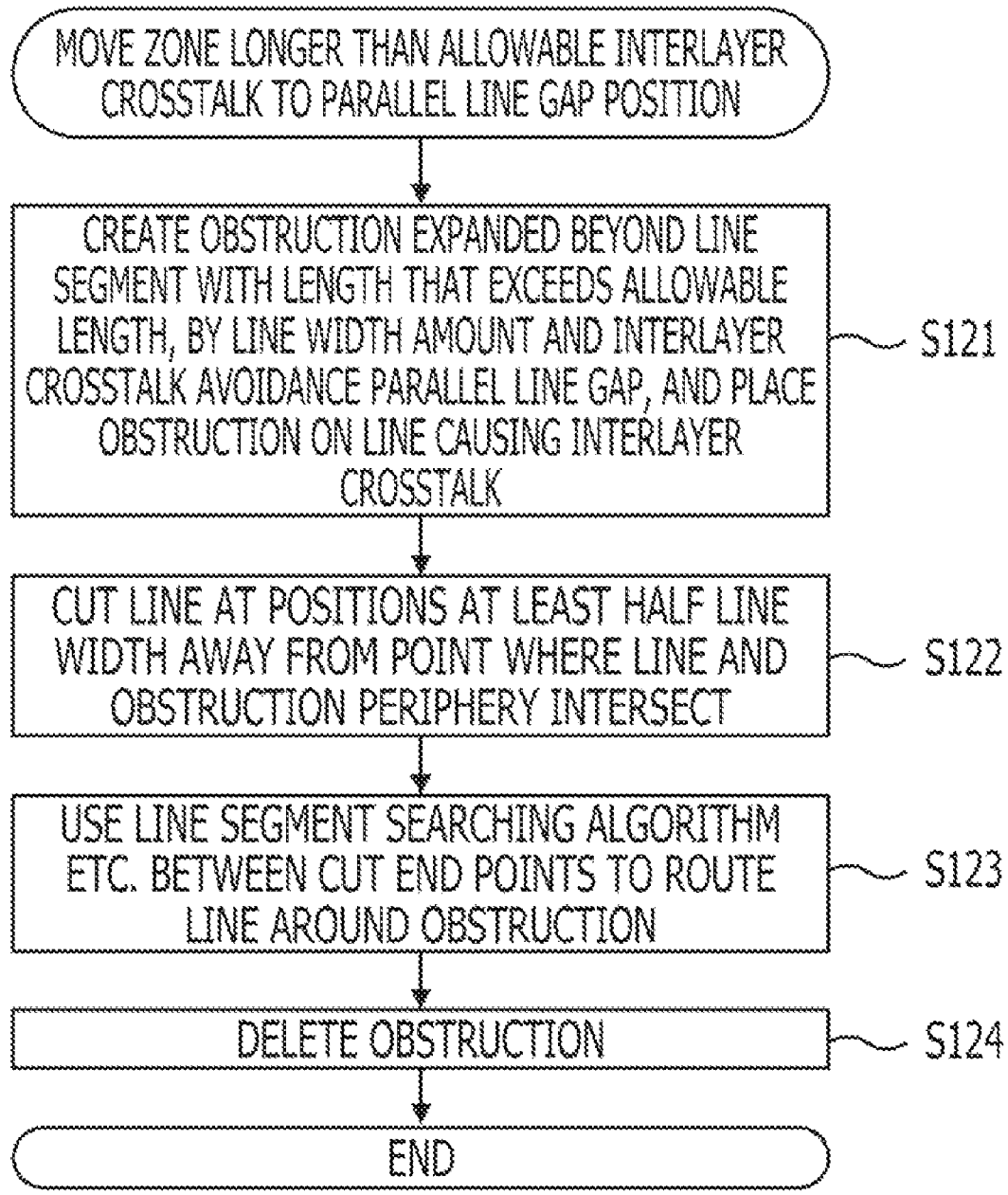
FIG. 27 is a detailed flowchart of the process in step S104.
Figure 28A:
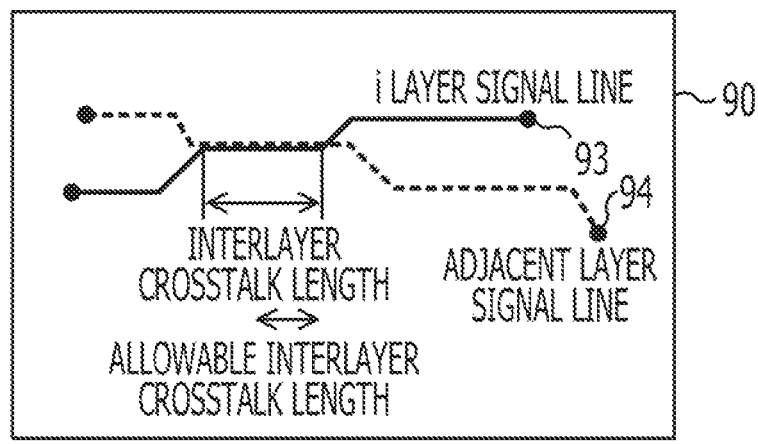
FIGS. 28A to 28C are images of the process of step S104.
Figure 28B:
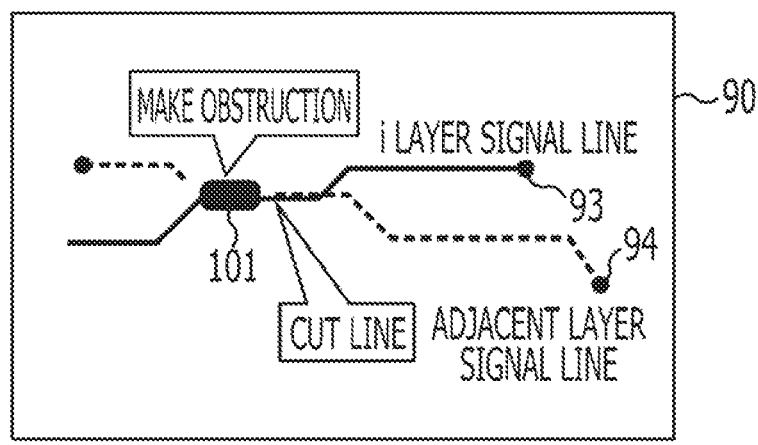
Figure 28C:
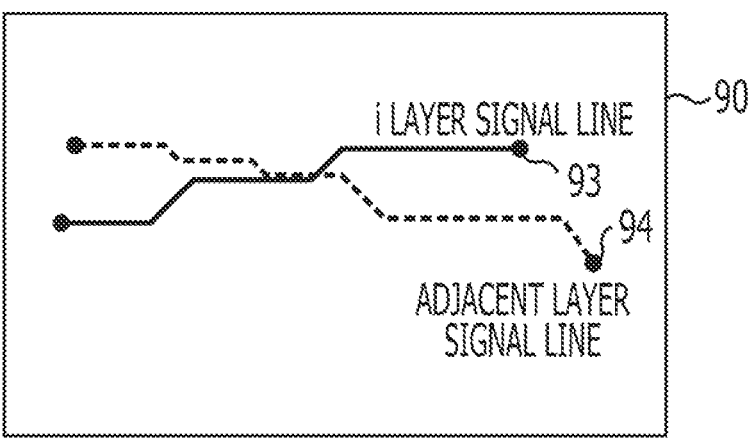

FIG. 27 illustrates the process conducted in step S104. FIG. 27 is a detailed flowchart of the process in step S104. FIGS. 28A to 28C illustrate images of the process of step S104.

As illustrated in FIG. 28A, the route of line 93 routed in the wiring layer i and the route of line 94 routed in the adjacent layer partially overlap. The overlapping part of lines 93 and 94 are an interlayer crosstalk zone that produces interlayer crosstalk. In FIG. 28A, the interlayer crosstalk length of the overlapping parts of the routes of the lines 93 and 94 exceeds the allowable length of interlayer crosstalk.

In step S121, the route modification processing unit 23, as illustrated in FIG. 28B, creates and temporarily places an obstruction 101 in a shape corresponding to a region expanded beyond a line segment with a length that exceeds the allowable length of interlayer crosstalk only for the "interlayer crosstalk avoidance parallel line gap" amount preset in the wiring constraint information 36 in the printed wiring board DB 25.

In step S122, the route modification processing unit 23 cuts the line 57 at a position that is at least half of the width of the line 57 away from an intersection point where the line 57 and the periphery of the obstruction 71 intersect. The route modification processing unit 23 deletes the part of the line 94 on the obstruction 101.

In step S123, the route modification processing unit 23 uses a well-known line segment searching algorithm (shortest routing) between the end points of the cut line 94 to conduct routing to bypass the obstruction 101 as illustrated in FIG. 28C. In step S124, the route modification processing unit 23 deletes the obstruction 101 and finishes the procedures of the flowchart illustrated in FIG. 27. The results of the route modification process conducted by the route modification processing unit 23 are reflected in the printed wiring board DB 25.

ILLUSTRATIVE EXAMPLE 5

Figure 29A:
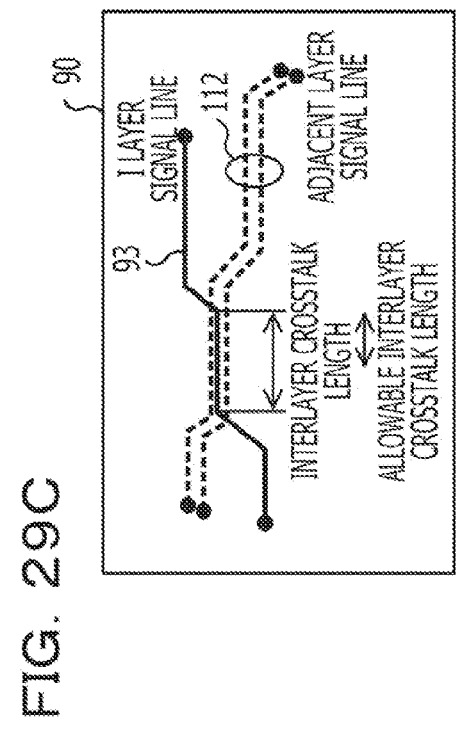
FIGS. 29A to 29D illustrate another example of the route modification process.
Figure 29C:
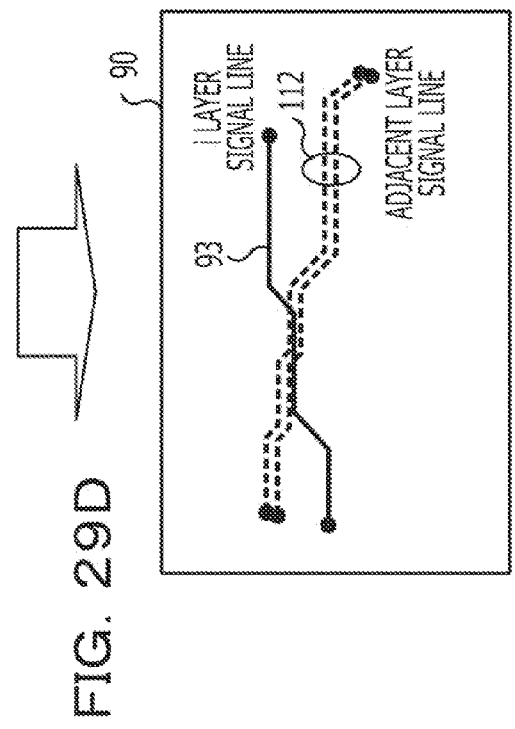
Figure 29B:
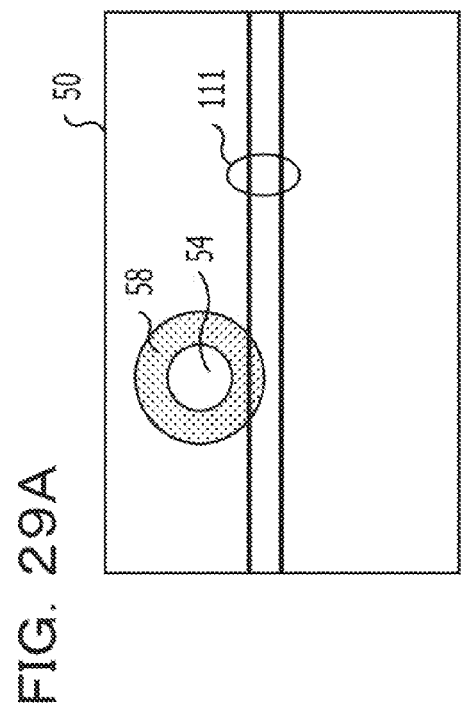

FIGS. 29A to 29D illustrate another example of the route modification process. The line length adjusting process is substantially the same as the first illustrative example and the description will be omitted. FIGS. 29A and 29B are transparent views of the printed wiring board 50 as seen from above. FIG. 29A is an example in which the line 57 in FIGS. 7A and 7B is now a paired line (paired wiring) 111. In FIG. 29A, the paired line 111 crosses the via clearance zone 58.

In FIG. 29B, route modification is conducted to create the bypass 62 that does not cross the via clearance zone 58 for the part of the paired line 111 that crosses the via clearance zone 58. The spacing of the paired line 111 is maintained.

Figure 29D:
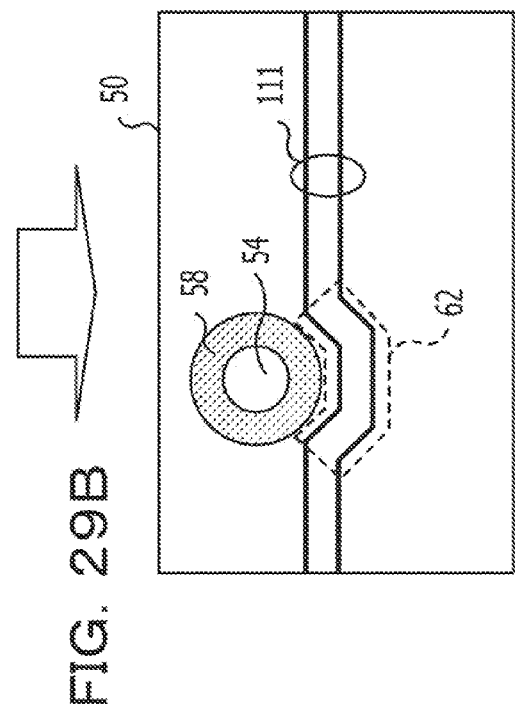

FIGS. 29C and 29D are transparent views of the printed wiring board 90 as seen from above. FIG. 29C is an example in which the line 94 in FIGS. 24A and 24B is now a paired line 112. As illustrated in FIG. 29C, the route of line 93 routed in the wiring layer i and the route of the paired line 112 routed in the adjacent layer partially overlap.

In FIG. 29D, a route modification is conducted in the interlayer crosstalk zone by moving the paired line 112 that runs parallel to line 93 between layers and exceeds the allowable length of interlayer crosstalk, to a parallel line gap position that can avoid interlayer crosstalk. The spacing of the paired line 112 is maintained.

Here, as an example of the route modification process, an example of modifying the route of the paired line 111 by moving the part of the paired line 111 that crosses the via clearance zone 58 to a position that avoids conditions where signals are contaminated by noise will be described.

Figure 30:
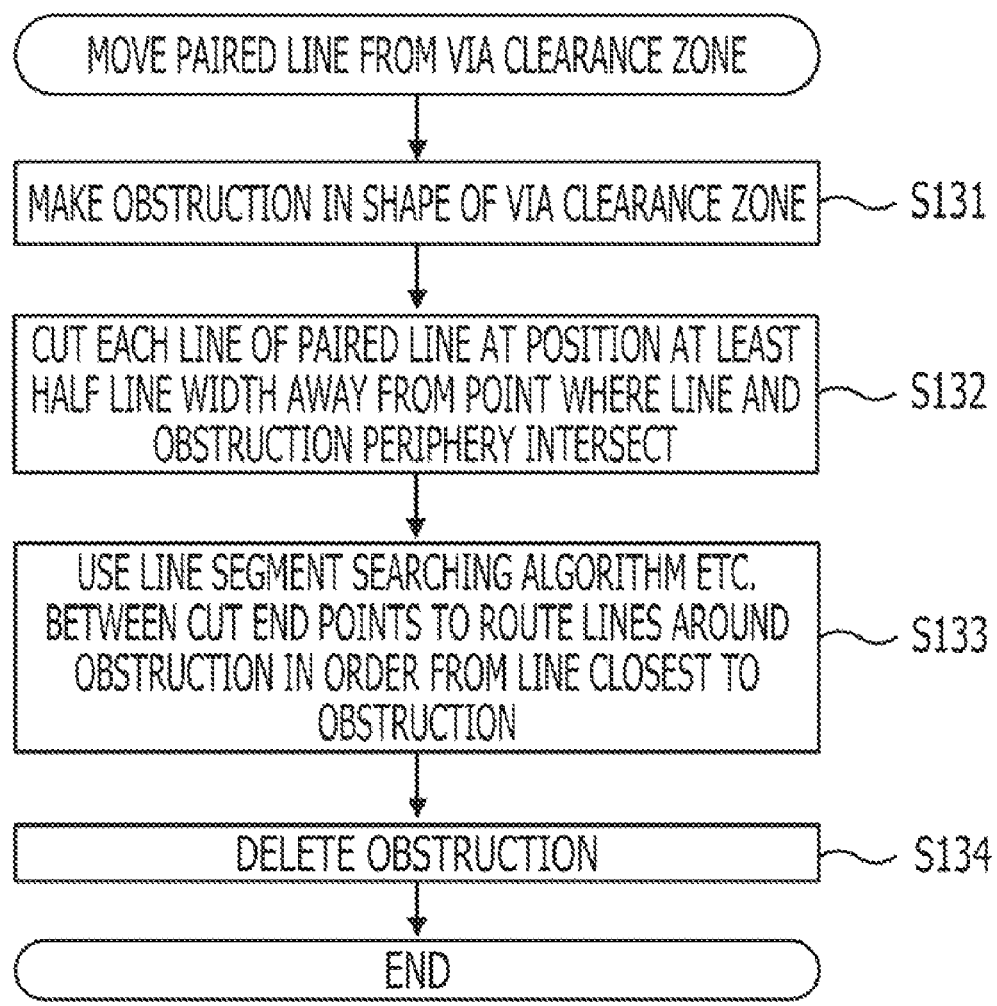
FIG. 30 is another example flowchart indicating details of the process in step S2.

FIG. 30 is another flowchart describing details of the step S2 process for handling the part of a paired line that crosses a via clearance zone. FIGS. 31A to 31D illustrate other images of the step S2 process for handling the part of a paired line that crosses a via clearance over.

Figure 31A:
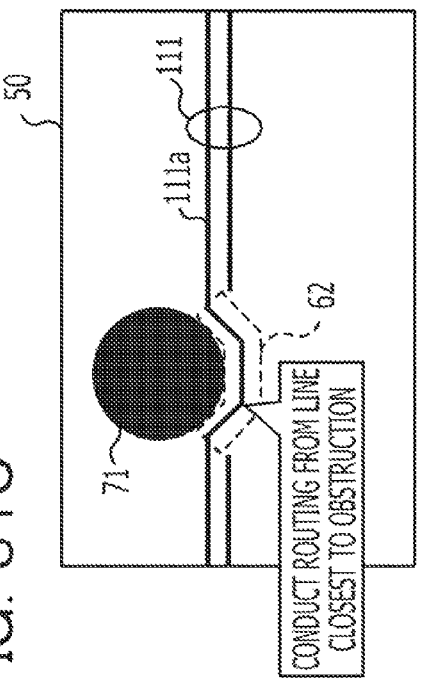
FIGS. 31A to 31D are other example images of the process in step S2.
Figure 31C:
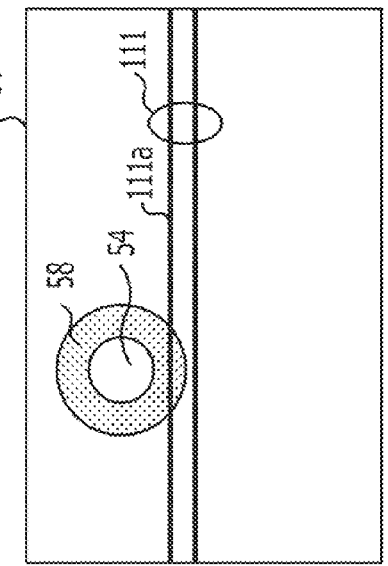
Figure 31B:
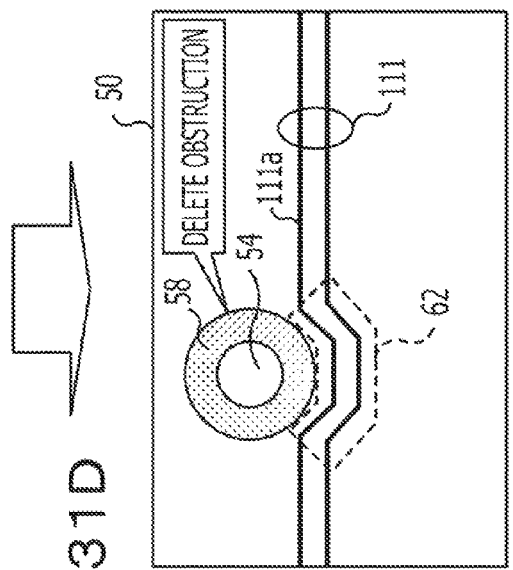

As illustrated in FIG. 31A, the paired line 111 crosses the via clearance zone 58. In step S131, the route modification processing unit 23 temporarily places an obstruction 71 with a shape that corresponds to the shape of the via clearance zone 58 on the via clearance zone 58 part as illustrated in FIG. 31B. The route modification processing unit 23 stores information on the obstruction 71 in, for example, the working data storage unit 26.

In step S132, the route modification processing unit 23 cuts each line 111a for the paired line 111 at a position that is at least half of the width of the line 111a away from an intersection point where the paired line 111 and the periphery of the obstruction 71 intersect as illustrated in FIG. 31B. The route modification processing unit 23 deletes the part of the paired line 111 on the obstruction 71.

Figure 31D:
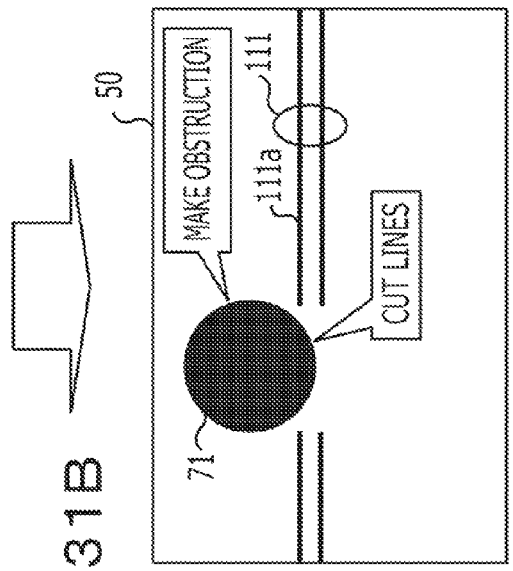

In step S133, the route modification processing unit 23 uses a well-known line segment searching algorithm (shortest routing) between the end points of the line 111a closest to the obstruction 71 among the two lines 111a of the cut paired line 111 to conduct routing to create the bypass 62 to avoid the obstruction 71. Furthermore, the route modification processing unit 23 uses the well-known line segment searching algorithm (shortest routing) between the end points of the line 111a that is the next closest to the obstruction 71 among the two lines 111a of the cut paired line 111, as illustrated in FIG. 31D, and conducts routing to maintain the spacing between the paired line 111. In other words, the process in step S133 is conducted in order from the line included in the paired line 111 that is closest to the obstruction 71.

Then, in step S134, the route modification processing unit 23 deletes the obstruction 71 and finishes the procedures of the flowchart illustrated in FIG. 30. The results of the route modification process conducted by the route modification processing unit 23 are reflected in the printed wiring board DB 25.

ILLUSTRATIVE EXAMPLE 6

FIGS. 32A to 32E illustrate another example of the route modification process. The line length adjusting process is the same as the first illustrative example and the description will be omitted. FIGS. 32A to 32E are transparent views of the printed wiring board 50 as seen from above. FIGS. 32A to 32E illustrate a process for conducting route modification to avoid crossing multiple via clearance zones 58 when a line 57 crosses multiple via clearance zones 58 under a BGA or the like.

Figure 32A:
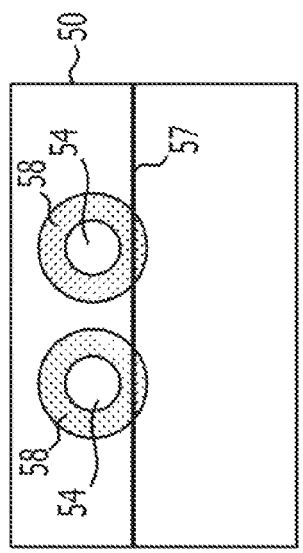
FIGS. 32A to 32E illustrate other examples of the route modification process.
Figure 32B:
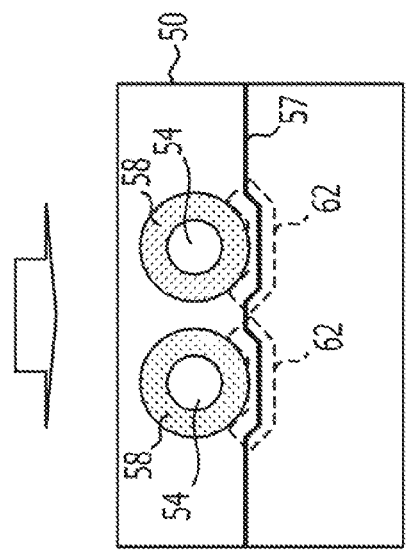

In FIG. 32A, the line 57 crosses two via clearance zones 58. In FIG. 32B, route modification is conducted to create two bypasses 62 that do not cross the via clearance zones 58 for the two parts of the line 57 that cross the via clearance zones 58. However, in FIG. 32B, a wasteful wave-like route is created between the two bypasses 62.

Figure 32C:
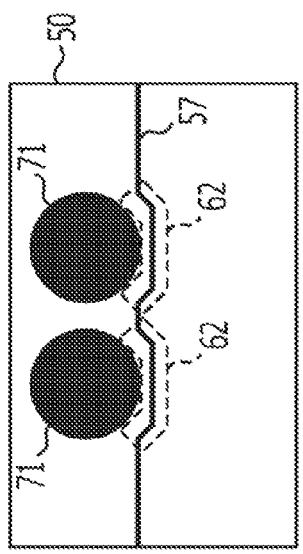
Figure 32D:
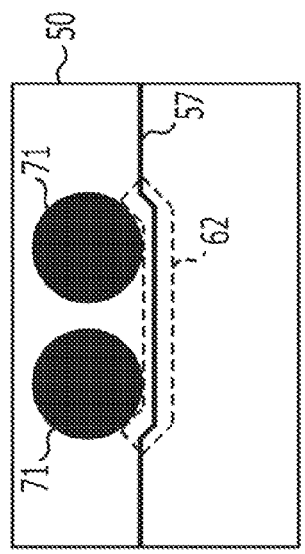
Figure 32E:
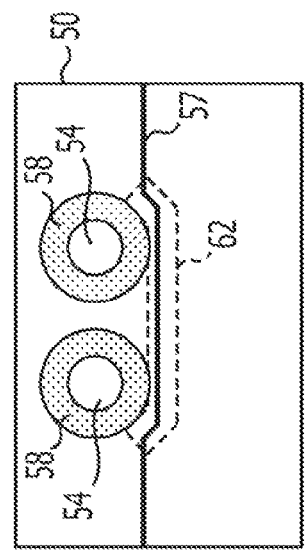

Therefore, in FIG. 32C, two obstructions 71 with shapes that correspond to the via clearance zones 58 placed on the via clearance zone 58 parts are kept in place and not deleted. In FIG. 32D, the wasteful and wave-like route between the two bypasses 62 is locally rerouted as described below and wasteful bending is removed. In FIG. 32E, the obstructions 71 are deleted. The line length adjustment processing load can be reduced by removing the wasteful bending.

Figure 33:
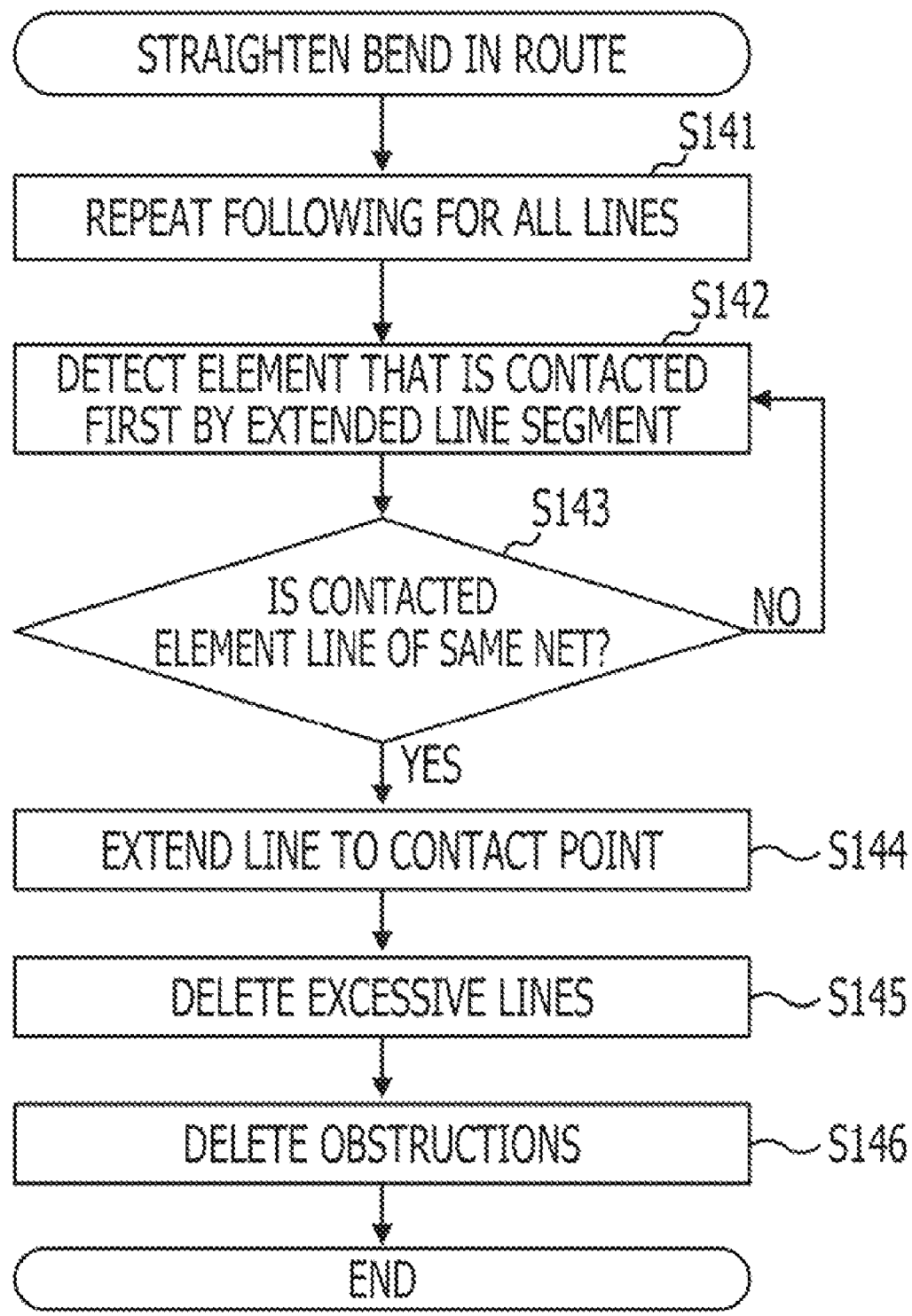
FIG. 33 is another example flowchart indicating details of the process in step S2.
Figure 34A:
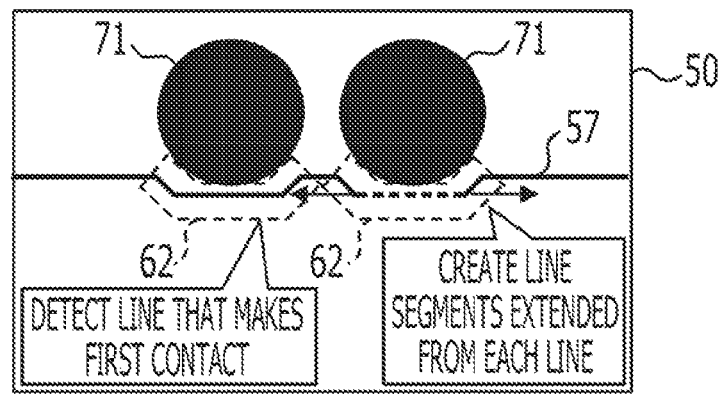
FIGS. 34A to 34C are other example images of the process in step S2.
Figure 34B:
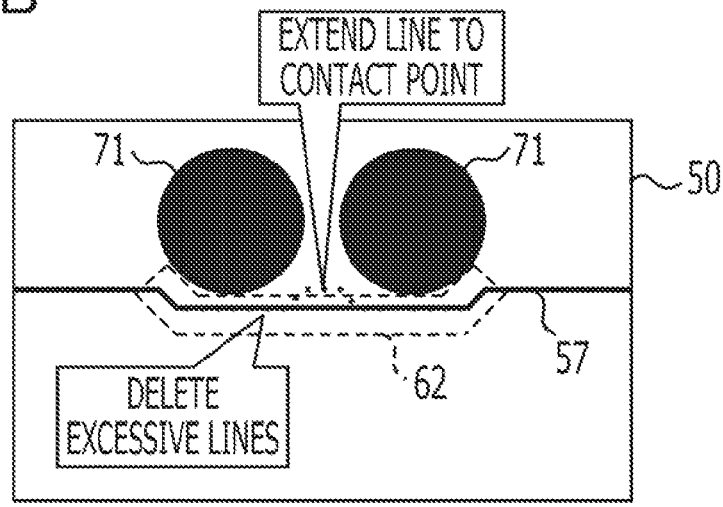
Figure 34C:
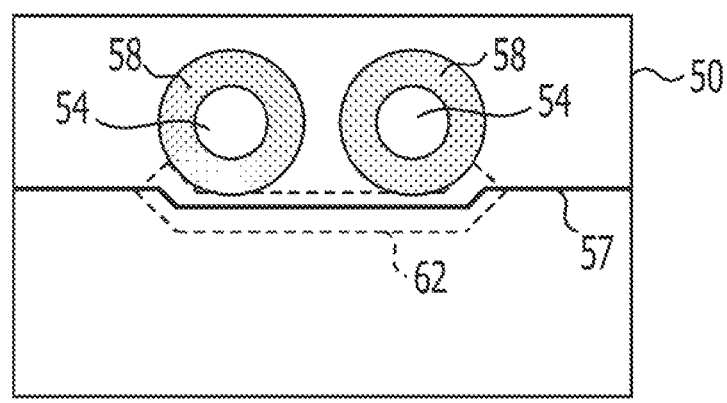

FIG. 33 is another flowchart describing details of the step S2 process for handling the part of a line that crosses a via clearance zone. FIGS. 34A to 34C illustrate other images of the step S2 process for handling the part of a line that crosses a via clearance zone.

As illustrated in FIG. 34A, route modification is conducted to create two bypasses 62 to prevent the line 57 from crossing the two via clearance zones 58. In step S141, the route modification processing unit 23 repeats the following process for all the lines with the bypasses 62. In step S142, the route modification processing unit 23 extracts an element that is contacted first by an extended line segment (extended line) of each line. For example, in FIG. 34A, the extended line of the right side bypass 62 touches the left side bypass 62.

In step S143, the route modification processing unit 23 determines whether or not the first contacted element is of the same net as the line 57. If the first contacted element is not of the same net as the line 57, the route modification processing unit 23 returns to step S141. If the first contacted element is of the same net as the line 57, the route modification processing unit 23 advances to step S144 and extends the line of the applicable bypass 62 to the contact point as illustrated in FIG. 34B.

In step S145, the route modification processing unit 23 deletes the wasteful wave-like route between the bypasses 62 as excessive lines. In step S146, the route modification processing unit 23 deletes the two obstructions 71 and finishes the procedures of the flowchart illustrated in FIG. 33. The results of the route modification process conducted by the route modification processing unit 23 are reflected in the printed wiring board DB 25.

The illustrative examples of the present embodiments describe examples in which the CAD device 1 implements wiring design for a printed wiring board that has multiple conductive layers. However, the wiring design may also be implemented by package software, or a web service, and the like.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments of the present inventions has been described in detail, it should be understood that various changes, substitutions, and alterations could be made hereto without departing from the spirit and scope of the invention.

What is claimed is:

1. A wiring design device to conduct wiring design on a printed wiring board that includes a plurality of conductive layers, the wiring design device comprising:
a noise contaminating part extracting unit to extract a part in a condition where noise contaminates a signal, the part being on a wiring-designed line, based on a route of the line and a physical condition around the route;
a route modification processing unit to modify the route of the line by moving the extracted part on the line in the condition where noise contaminates the signal to a position that avoids the condition where noise contaminates the signal; and
a line length adjusting unit to conduct a line length adjustment on the line to compensate for a variation of the line length of the line when the variation of the line length of the line occurs due to modifying the route of the line, wherein
the route modification processing unit modifies the route of the line so that a part on the line crossing a position that is on a wiring layer and that corresponds to a clearance for isolating a plane pattern and a via provided on an adjacent layer, crosses the position on the wiring layer corresponding to the plane pattern provided on the adjacent layer.

2. The wiring design device according to claim 1 wherein, the route modification processing unit modifies the route of the line to cross the position on the wiring layer that corresponds to the plane pattern provided on the adjacent layer so that, based on an allowable number that allows the line to cross the position that is on the wiring layer and that corresponds to the clearance provided on the adjacent layer, the line does not cross the position on the wiring layer that corresponds to the clearance provided on the adjacent layer after exceeding the allowable number.

3. The wiring design device according to claim 1 wherein, the route modification processing unit modifies the route of the line so that a part on the line crossing a position on a wiring layer that corresponds to a position equal to or less than a desired distance away from a plane pattern periphery provided on an adjacent layer crosses a position that is on the wiring layer and that corresponds to a position equal to or greater than the desired distance away from the plane pattern periphery provided on the adjacent layer.

4. The wiring design device according to claim 1 wherein, the route modification processing unit modifies the route of the line on the wiring layer so that a part of the line that runs parallel to a position that is on a wiring layer and that corresponds to a route of a line provided on an adjacent layer crosses a position at least a parallel line gap away from the position on the wiring layer corresponding to the route of the line provided on the adjacent layer.

5. The wiring design device according to claim 4 wherein, the route modification processing unit modifies the route of the line on the wiring layer so that, based on an allowable length that allows the line on the wiring layer to run parallel to the position that is on the wiring layer and that corresponds to the route of the line provided on the adjacent layer, the line on the wiring layer does not run parallel to the position that is on the wiring layer and that corresponds to the route of the line on the adjacent layer after exceeding the allowable length.

6. The wiring design device according to claim 1 wherein, the route modification processing unit modifies a route of a paired line so that a gap between the lines of the paired line is maintained when the line is the paired line.

7. The wiring design device according to claim 1 wherein, the route modification processing unit straightens a generated bend in the route of the line when the route of the line is modified.

8. A wiring design method executed by a computer to conduct wiring design on a printed wiring board that includes a plurality of conductive layers, the wiring design method comprising:

extracting, using a computer, a part in a condition where noise contaminates a signal, the part being on a wiring-designed line, based on a route of the line and a physical condition around the route;

modifying, using the computer, the route of the line by moving the extracted part on the line in the condition where noise contaminates the signal to a position that avoids the condition where noise contaminates the signal; and conducting, using the computer, a line length adjustment on the line to compensate for a variation of the line length of the line when the variation of the line length of the line occurs due to modifying the route of the line, wherein the modifying modifies the route of the line so that a part on the line crossing a position that is on a wiring layer and that corresponds to a clearance for isolating a plane pattern and a via provided on an adjacent layer, crosses the position on the wiring layer corresponding to the plane pattern provided on the adjacent layer.

9. A recording medium storing a program that causes a computer to execute wiring design on a printed wiring board that includes a plurality of conductive layers, the program causing the computer to perform operations comprising:

extracting a part in a condition where noise contaminates a signal, the part being on a wiring design line, based on a route of the line and a physical condition around the route;

modifying the route of the line by moving the extracted part on the line in the condition where noise contaminates the signal to a position that avoids the condition where noise contaminates the signal; and conducting a line length adjustment on the line to compensate for a variation of the line length of the line when the variation of the line length of the line occurs due to modifying the route of the line, wherein the modifying modifies the route of the line so that a part on the line crossing a position that is on a wiring layer and that corresponds to a clearance for isolating a plane pattern and a via provided on an adjacent layer, crosses the position on the wiring layer corresponding to the plane pattern provided on the adjacent layer.

10. A wiring design device to conduct wiring design on a printed wiring board that includes a plurality of conductive layers, the wiring design device comprising:

a noise contaminating part extracting unit to extract a part in a condition where noise contaminates a signal, the part being on a wiring-designed line, based on a route of the line and a physical condition around the route;

a route modification processing unit to modify the route of the line by moving the extracted part on the line in the condition where noise contaminates the signal to a position that avoids the condition where noise contaminates the signal; and a line length adjusting unit to conducting a line length adjustment on the line to compensate for a variation of the line length of the line when the variation of the line length of the line occurs due to modifying the route of the line, wherein the route modification processing unit modifies the route of the line so that a part on the line crossing a position that is on a wiring layer and that corresponds to a clearance for isolating a plane pattern and a via provided on an adjacent layer, crosses the position on the wiring layer corresponding to the plane pattern provided on the adjacent layer.

11. The wiring design device according to claim 10 wherein, the route modification processing unit modifies the route of the line to cross the position on the wiring layer that corresponds to the plane pattern provided on the adjacent layer so that, based on an allowable number that allows the line to cross the position that is on the wiring layer and that corresponds to the clearance provided on the adjacent layer, the line does not cross the position on the wiring layer that corresponds to the clearance provided on the adjacent layer after exceeding the allowable number.

12. The wiring design device according to claim 10 wherein, the route modification processing unit modifies the route of the line so that a part on the line crossing a position on a wiring layer that corresponds to a position equal to or less than a desired distance away from a plane pattern periphery provided on an adjacent layer crosses a position that is on the wiring layer and that corresponds to a position equal to or greater than the desired distance away from the plane pattern periphery provided on the adjacent layer.

13. The wiring design device according to claim 10 wherein, the route modification processing unit modifies the route of the line on the wiring layer so that a part of the line that runs parallel to a position that is on a wiring layer and that corresponds to a route of a line provided on an adjacent layer crosses a position at least a parallel line gap away from the position on the wiring layer corresponding to the route of the line provided on the adjacent layer.

14. The wiring design device according to claim 13 wherein, the route modification processing unit modifies the route of the line on the wiring layer so that, based on an allowable length that allows the line on the wiring layer to run parallel to the position that is on the wiring layer and that corresponds to the route of the line provided on the adjacent layer, the line on the wiring layer does not run parallel to the position that is on the wiring layer and that corresponds to the route of the line on the adjacent layer after exceeding the allowable length.

15. The wiring design device according to claim 10 wherein, the route modification processing unit modifies a route of a paired line so that a gap between the lines of the paired line is maintained when the line is the paired line.

16. The wiring design device according to claim 10 wherein, the route modification processing unit straightens a generated bend in the route of the line when the route of the line is modified.

* * * * *